(12) United States Patent
Shacham et al.

(10) Patent No.: US 8,966,413 B2
(45) Date of Patent: Feb. 24, 2015

(54) SYSTEM AND METHOD FOR A CHIP GENERATOR

(75) Inventors: Ofer Shacham, Palo Alto, CA (US); Mark Horowitz, Menlo Park, CA (US); Stephen Richardson, Los Altos, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 13/399,770

(22) Filed: Feb. 17, 2012

(65) Prior Publication Data

US 2012/0324408 A1 Dec. 20, 2012

Related U.S. Application Data

(60) Provisional application No. 61/444,113, filed on Feb. 17, 2011.

(51) Int. Cl.
*G06F 17/50* (2006.01)

(52) U.S. Cl.
CPC ................... *G06F 17/5045* (2013.01)
USPC ........... 716/100; 716/101; 716/102; 716/103; 716/104

(58) Field of Classification Search
CPC .............. G06F 17/505; G06F 17/5022; G06F 17/5045; G06F 2217/86
USPC .......................... 716/100–107, 138
See application file for complete search history.

(56) References Cited

U.S. PATENT DOCUMENTS

| | | | |
|---|---|---|---|
| 2007/0083844 A1* | 4/2007 | Kabuo et al. | 716/18 |
| 2008/0127026 A1* | 5/2008 | Murase | 716/18 |
| 2008/0222581 A1* | 9/2008 | Banerjee et al. | 716/4 |

OTHER PUBLICATIONS

T. Austin et al.: An infrastructure for computer system modeling. Computer, 35(2):59-67, 2002.
Omid Azizi. Design and Optimization of Processors for Energy Efficiency: A Joint Architecture-Circuit Approach. PhD thesis, Stanford University, 2010.
N.L. Binkert et al. The M5 simulator: Modeling networked systems. IEEE Micro, 26(4):52-60, 2006.
Wei Han et al. Multicore architectures with dynamically reconfigurable array processors for wireless broadband technologies. Trans. Comp.-Aided Des. Integ. Cir. Sys., 28(12):1830-1843, 2009.

(Continued)

*Primary Examiner* — Paul Dinh
(74) *Attorney, Agent, or Firm* — Guadalupe M. Garcia

(57) ABSTRACT

A chip generator according to an embodiment of the present invention codifies designer knowledge and design trade-offs into a template that can be used to create many different chips. Like reconfigurable designs, an embodiment of the present invention fixes the top level system architecture, amortizes software and validation and design costs, and enables a rich system simulation environment for application developers. Meanwhile, below the top level, the developer can "program" the individual inner components of the architecture. Unlike reconfigurable chips, a chip generator according to an embodiment of the present invention, compiles the program to create a customized chip. This compilation process occurs at elaboration time—long before silicon is fabricated. The result is a framework that enables more customization of the generated chip at the architectural level because additional components and logic can be added if the customization process requires it.

21 Claims, 11 Drawing Sheets

(56) References Cited

OTHER PUBLICATIONS

H. Kaul et al. A 300mV 494GOPS/W reconfigurable dual-supply 4-way SIMD vector processing accelerator in 45nm CMOS. In IEEE International Solid-State Circuits Conference(ISSCC)—Digest of Technical Papers, pp. 260-261, 2009.

K. Mai et al. Smart memories: a modular reconfigurable architecture. Computer Architecture, 2000. Proceedings of the 27th International Symposium on, pp. 161-171, 2000.

A.S. Vincentelli et al. Platform-based design. IEEE Design & Test, 18(6):23-33, 2001.

* cited by examiner

Figure 8

Usage:
$NewSubInst = $self->unique_inst(SomeTemplateName, NewInstName, PrmName=>PrmVal)

Actions:

1. Remember the current $self parameter's priority, and assign $self parameter's priority to ZERO_PRIORITY (to stop any attempts by the sub-instance to change/add parameters of $self)

2. Verify the existence of the template SomeTemplateName

3. Create a new sub-instance object of SomeTemplateName.pm (referred hereinafter as $NewSubInst)

(a) Update global modules database on the creation of a new module based on template SomeTemplateName. Tentatively name it SomeTemplateName_unqN where N-1 is the number of already existing unique modules generated from template SomeTemplateName (assume it will be uniquified; roll back later if needed)

(b) Update $NewSubInst about its template source and its newly created module type (c) Update $NewSubInst about its relevant XML entry location in the input configuration file (if it exists)

(d) Set $NewSubInst parameter's priority to INHERITANCE_PRIORITY. Assign parameters based on the unique_inst invocation command (i.e., create a parameter named PrmName at priority INHERITANCE_PRIORITY and assign it with the value PrmVal)

4. Recursively execute on $NewSubInst:

(a) Set $NewSubInst parameter's priority to EXTERNAL_CONFIG_PRIORITY. Assign $NewSubInst parameters based on the input configuration file (if it exists)

(b) Set $NewSubInst parameter's priority to DECLARATION_PRIORITY (to enable new parameter definitions by user code in the template itself)

(c) Invoke $NewSubInst's to_verilog method to generate the new module, based on the applied parameters and the template (i.e., the SomeTemplateName.pm package)

5. Set $NewSubInst parameter's priority to ZERO_PRIORITY—no more changes allowed in $NewSubInst after its module has been generated!

6. Handle uniquification:

(a) Compare newly generated module SomeTemplateName_unqN to all N-1 previously generated modules for template SomeTemplateName (b) If a match was found, discard the new module by both updating the $NewSubInst object and rolling back the global modules database (c) Else do nothing 7. Reapply $self parameter's priority as stored in item 1 (to re-enable additions to $self parameters)

Figure 9

SYSTEM AND METHOD FOR A CHIP GENERATOR

FIELD OF THE INVENTION

The present invention generally relates to the field of electronic design automation. More particularly, the present invention relates to a design framework that can generate designs for semi-custom chips.

BACKGROUND OF THE INVENTION

Recent changes in technology scaling have made power dissipation today's major performance limiter. As a result, designers struggle to meet performance requirements under stringent power budgets. At the same time, the traditional solution to power efficiency, application specific designs, has become prohibitively expensive due to increasing nonrecurring engineering (NRE) costs. Most concerning are the development costs for design, validation, and software for new systems.

One direction that industry has attempted, with the goal of mitigating the rising costs of per-application designs, is to add a layer of programmability that specifies how the hardware operates. An example of this approach includes baseband processors for software-defined-radio (SDR) wireless devices. Similarly, a study, Stanford Smart Memories (SSM), showed that it is possible to build a reconfigurable chip multiprocessor memory system that can be customized for specific application needs. These programmable, or reconfigurable, hardware solutions enable per-application customization and amortization of NRE costs—to a limited extent. But reconfigurability introduces overheads at the circuit level, and customization is limited to those resources that were decided upon, and verified, upfront.

SUMMARY OF THE INVENTION

An embodiment of the present invention harnesses the ideas of reconfigurable designs to build a design framework that can generate semi-custom chips. A Chip Generator according to an embodiment of the present invention is disclosed that codifies the designer knowledge and design tradeoffs into a template that can be used to create many different chips. Like reconfigurable designs, these systems fix the top level system architecture, amortizing software and validation and design costs, and enabling a rich system simulation environment for application developers. Meanwhile, below the top level, the developer can "program" the individual inner components of the architecture. Unlike reconfigurable chips, a chip generator according to an embodiment of the present invention "compiles" the program to create a customized chip. This compilation process occurs at elaboration time—long before silicon is fabricated. The result is a framework that enables more customization of the generated chip at the architectural level because additional components and logic can be added if the customization process requires it. At the same time this framework does not introduce inefficiency at the circuit level because unneeded circuit overheads are not taped out.

The design of a chip generator according to an embodiment of the present invention is significantly different than the design of a single chip instance since the chip generator must account for a much larger design and verification space. An embodiment of the present invention is a chip generator tool that can serve as a design framework for chips. Using a chip generator according to embodiments of the present invention, designers can write elaboration programs, or "recipes," for how the hardware blocks need to be constructed given a set of constraints, rather than hard code a particular solution. Chip generators according to embodiments of the present invention enable a standardized method for creation of module generators and for aggregating unit level generators together into a full chip generator. Ultimately, chip generators according to embodiments of the present invention enable users to design an entire family of chips at once so that producing custom chips becomes a matter of adjusting a system configuration file.

While logic validation of a generator may at first seem like an infeasible or very expensive task, embodiments of the present invention demonstrate that this is in fact not the case. The first key insight that enables efficient validation is that only generated instances may need to be validated—not the generator. This means that the generator can be leveraged to generate many of the validation components such as drivers, monitors and assertions, alongside the design itself. The second insight is that the validation approach can be oblivious to low level customizations details, and instead thoroughly check correctness at the higher, system level. The result is that testing multiple hardware configurations does not become harder than testing one. Moreover, a chip generator may even improve validation quality and reduce validation time because, by testing multiple closely related configurations, the probability of exposing corner case bugs increases.

Using Chip Generators according to the present invention enables design houses to design a wide family of chips using a cost structure similar to that of designing a single chip—potentially saving tens of millions of dollars—while enabling per-application customization and optimization.

These and other embodiments can be more fully appreciated upon an understanding of the detailed description of the invention as disclosed below in conjunction with the attached figures.

BRIEF DESCRIPTION OF THE DRAWINGS

The following drawings will be used to more fully describe embodiments of the present invention.

FIG. 8 is an illustration of parsing and transforming a template into a Perl package according to an embodiment of the present invention.

FIG. 9 shows an example of pseudo code according to the invention according to an embodiment of the present invention.

DETAILED DESCRIPTION OF THE INVENTION

The following description is of certain preferred embodiments presently contemplated for carrying out this invention. This description is made for the purpose of illustrating the general principles of this invention and is not meant to limit the inventive concepts claimed herein.

The present application claims priority to Provisional Application Ser. No. 61/444,113, entitled "System and Method for Automatic Generation of Custom and Heterogeneous Compute Platforms" and filed on Feb. 17, 2011, that is herein incorporated by reference for all purposes.

Computer System

Figure 1:
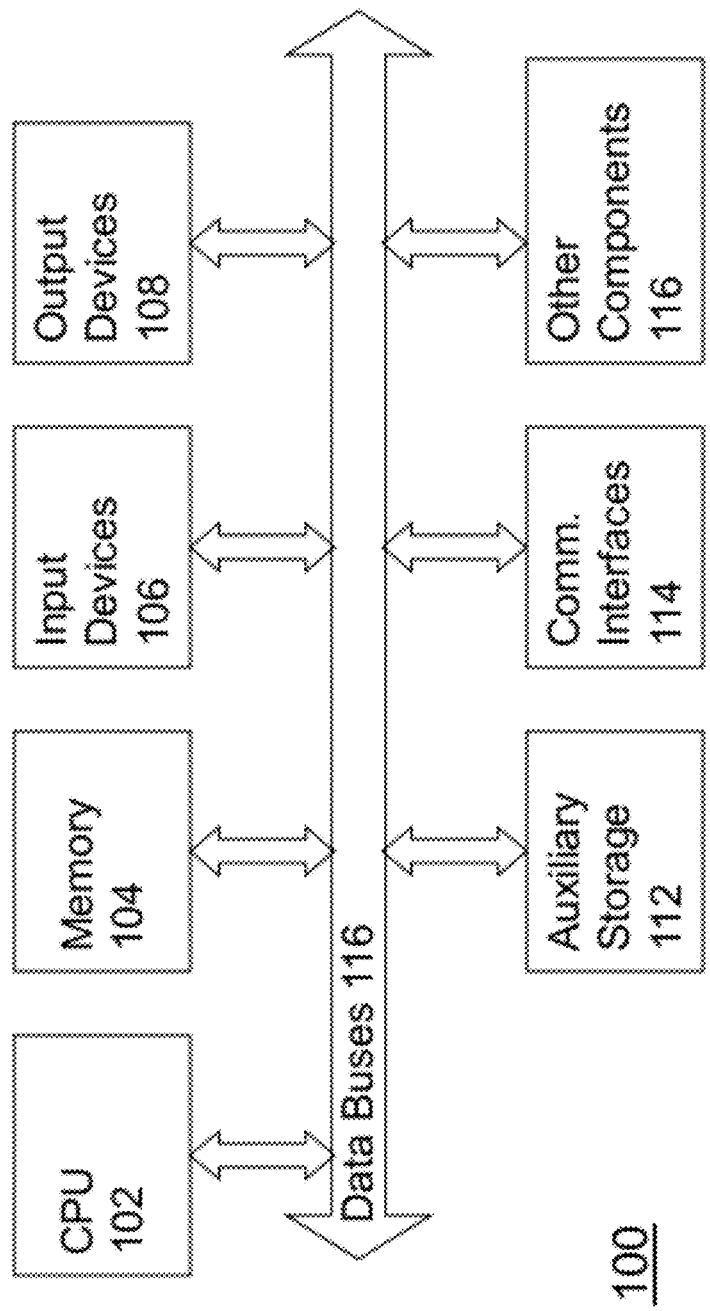
FIG. 1 is a block diagram of a computer system on which embodiments of the present invention can be implemented.

Among other things, the present invention relates to methods, techniques, and algorithms that are intended to be implemented in a digital computer system 100 such as generally shown in FIG. 1. Such a digital computer is well-known in the art and may include the following.

Computer system 100 may include at least one central processing unit 102 but may include many processors or processing cores. Computer system 100 may further include memory 104 in different forms such as RAM, ROM, hard disk, optical drives, and removable drives that may further include drive controllers and other hardware. Auxiliary storage 112 may also be include that can be similar to memory 104 but may be more remotely incorporated such as in a distributed computer system with distributed memory capabilities.

Computer system 100 may further include at least one output device 108 such as a display unit, video hardware, or other peripherals (e.g., printer). At least one input device 106 may also be included in computer system 100 that may include a pointing device (e.g., mouse), a text input device (e.g., keyboard), or touch screen.

Communications interfaces 114 also form an important aspect of computer system 100 especially where computer system 100 is deployed as a distributed computer system. Computer interfaces 114 may include LAN network adapters, WAN network adapters, wireless interfaces, Bluetooth interfaces, modems and other networking interfaces as currently available and as may be developed in the future.

Computer system 100 may further include other components 116 that may be generally available components as well as specially developed components for implementation of the present invention. Importantly, computer system 100 incorporates various data buses 116 that are intended to allow for communication of the various components of computer system 100. Data buses 116 include, for example, input/output buses and bus controllers.

Indeed, the present invention is not limited to computer system 100 as known at the time of the invention. Instead, the present invention is intended to be deployed in future computer systems with more advanced technology that can make use of all aspects of the present invention. It is expected that computer technology will continue to advance but one of ordinary skill in the art will be able to take the present disclosure and implement the described teachings on the more advanced computers or other digital devices such as mobile telephones or "smart" televisions as they become available. Moreover, the present invention may be implemented on one or more distributed computers. Still further, the present invention may be implemented in various types of software languages including C, C++, and others. Also, one of ordinary skill in the art is familiar with compiling software source code into executable software that may be stored in various forms and in various media (e.g., magnetic, optical, solid state, etc.). One of ordinary skill in the art is familiar with the use of computers and software languages and, with an understanding of the present disclosure, will be able to implement the present teachings for use on a wide variety of computers.

The present disclosure provides a detailed explanation of the present invention with detailed explanations that allow one of ordinary skill in the art to implement the present invention into a computerized method. Certain of these and other details are not included in the present disclosure so as not to detract from the teachings presented herein but it is understood that one of ordinary skill in the at would be familiar with such details.

Introduction

Power constraints are changing how chips are designed today. Changes to technology scaling, post-90 nm, for example, have compromised the ability to keep power in check, which means many systems designed today, from high performance servers to wireless sensors, are becoming energy constrained. Years of research has demonstrated that the best way to save energy is to cut waste. Clock and power gating, now common techniques, reduce direct energy waste in unused circuits. Power is also wasted indirectly when performance is wasted. As is well known, higher performance requirements lead to higher energy operations, so removing performance waste also reduces energy per operation. Using multiple simpler units rather than a single aggressive one, saves energy when processing parallel tasks. At the system level, this observation is driving the recent push for parallel computing.

Ultimately, the best tool in our power-saving arsenal is customization because the most effective way to improve energy efficiency is to find a solution that accomplishes the same task with less work. By specializing hardware to a specific application, customization results in energy savings by requiring less work. Better still, since less work is needed, performance improves, allowing even greater reduction of the required energy. For many applications, adding a few specialized hardware units greatly reduces the required work, making application specific integrated circuits (ASICs) orders of magnitude more energy efficient than a CPU for that application.

Despite the clear energy efficiency advantage of ASICs, the number of new ASICs built today is not increasing but actually decreasing. The reason is that non-recurring engineering (NRE) costs for ASIC design have become extremely expensive, and very few applications have markets big enough to justify these costs. This uneasy status quo is reminiscent of chip design problems in the early 1980s when almost all chips were designed by full custom techniques. At that time, few companies had the skills or the resources to create chips. Synthesis and place-and-route tools dramatically reduced design costs and enabled cost effective ASICs. Over the past 25 years, however, complexity has grown, creating the need for another design innovation.

To enable this innovation, the first main issue needs to be faced: building a completely new complex system is expensive. The cost of design and verification has long exceeded tens of millions of dollars. Moreover, hardware is half the story. New architectures require expensive new software ecosystems to be useful. Developing these tools and code is also expensive. Providing a designer with complex IP blocks does not solve this problem: the assembled system is still complex and still requires custom verification and software. Furthermore, verification costs still trend with system complexity and not with the number of individual blocks used. To address some of these design costs, the industry has been moving toward platform-based designs, where the system architecture has been fixed.

While such strategies address some of the design costs, these general, programmable platforms still do not provide the desired ASIC-like performance and power efficiency. The amount of resources in a programmable platform (e.g., compute engines, instruction and data caches, processor width, memory bandwidth, etc.) is never optimal for any particular application. Since the power and area of the chip are limited, a compromise among the expected use-cases is typically implemented. Similarly, adding configuration registers to a design also implies adding circuit inefficiencies, such as muxes in data paths or table look-ups for control, impeding both performance and energy. Furthermore, while a reconfigurable chip is likely to work in the modes for which it was designed and tested, and perhaps for some closely related configurations, it is doubtful if a completely new use-case would work efficiently the first time.

It seems that on one hand, a reconfigurable platform based approach does not provide the required performance and power efficiency, and on the other, ASIC based solutions are too expensive for most applications. The key to solving this impasse is to understand that while a customized chip cannot be built for every application, one application's design process can be reused to generate multiple new chips. For example, many applications within a domain may require similar systems with small variations in hardware units, or the same application may be used in multiple target devices with different power and performance constraints.

While a configurable chip cannot be as efficient as its set of application-specific counter-parts, suppose the one piece of "secret sauce" that makes that application work could be introduced. A system configuration could then be generated (rather than programmed) that meets the power and performance constraints. Then, the chip is fabricated. In this process, a much more efficiently designed chip could be achieved.

Furthermore, every time a chip is built, different design decisions are evaluated, either implicitly using micro-architectural and domain knowledge, or explicitly through custom evaluation tools. While this process could help create other, similar chips, today these trade-offs are often not recorded. A particular target implementation compromised and the solution is recorded or a chip is created that is a superset or a compromise among design choices (and is less than optimal).

Figure 11:
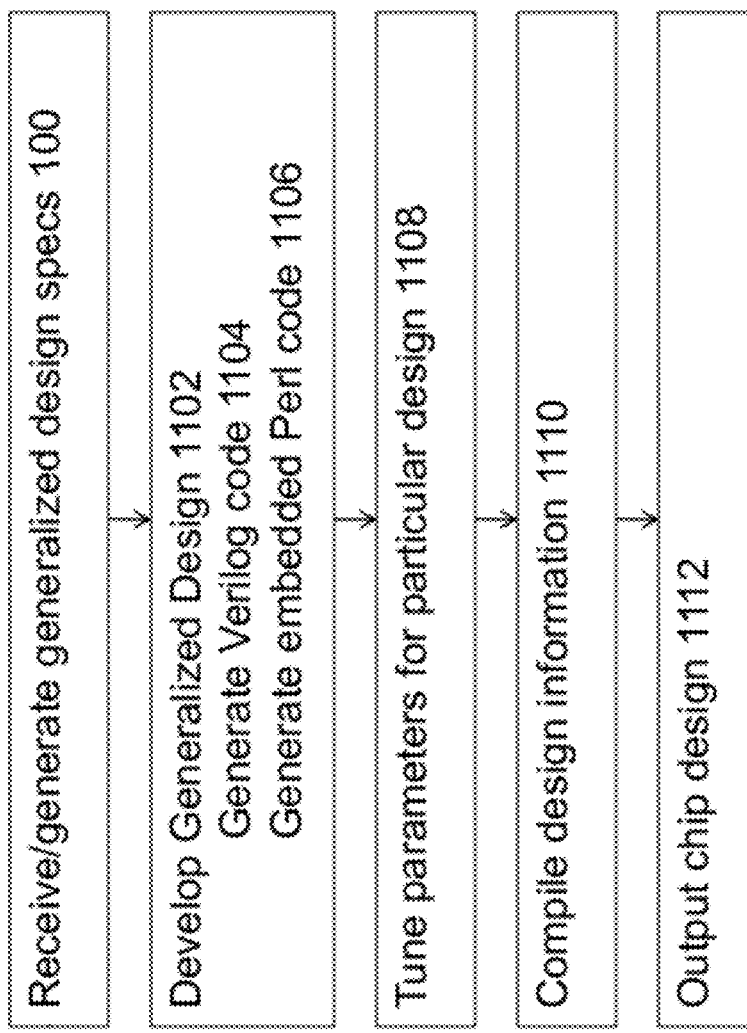
FIG. 11 is a flowchart depicting a method according to an embodiment of the present invention.

Shown in FIG. 11 is a flowchart depicting a method for implementing a chip generator according to an embodiment of the invention. As shown in FIG. 11, at step 1100 generalized design parameters are received or generated. In response, at step 1102, a generalized design is developed. Here, the chip generator approach according to an embodiment of the present invention uses a fixed system architecture, or "template," to simplify both software development and hardware verification. This template is comprised of highly parameterized modules, to enable pervasive customization of the hardware. In an embodiment, these templates are developed by generating Verilog code (step 1104) along with generating certain embedded Perl code (step 1106). The Perl code in conjunction with the Verilog code allows for embedding certain designer knowledge into the generalized design. For example, a designer using the Perl code could embed certain parameters for a generalized CPU. Later, a separate user, an application developer, for example, can tune the availed parameters (step 1108) of the chip to meet a desired specification. The chip generator compiles this information (step 1110) and deploys optimization procedures to produce the final chip (step 1112). This process results in customized chips (e.g., function units and memories) that can have optimized features (e.g., reduced power consumption).

Embodiments of the present invention will be described with reference to Verilog but those of ordinary skill in the art will understand that the present teachings can be extended for implementation with other hardware description languages as well as other electronic design automation tools. Indeed, the teachings of the present invention can be implemented at the register-transfer level of abstraction as well as other levels of abstraction. Also, Perl is implemented as a high-level dynamic programming language that is able to modify Verilog code for particularized designs through the choice of design parameters.

In such an embodiment, implicit and explicit knowledge is advantageously embedded in the constructed modules, allowing others, with different goals or constraints, to create different chip instances with much more facility. In this embodiment, rather than building a custom chip, designers create a generalized module that can generate particular and specialized chips. Those of ordinary skill in the art will understand that the present teachings can be extended for implementation with other programming languages.

Since this approach is different than traditional ASIC, SoC or other current chip design strategies, the first steps in realizing it are to create a design tool chain that can easily embed designers knowledge into the modules they create, and allow hierarchical assembly of these modules into a generator.

A few design examples will be discussed, but rather than describing the hardware architecture, the designer thought process will be emphasized including: how design choices are made, which design choice should be set by the generator user (e.g., the application engineer), and which should be inferred from a previously made choice or calculated by optimization scripts. From this analysis, the problem is found to be in embedding designer knowledge and design process into the generator is that it requires more designer control over the elaboration process, than is currently available in standard hardware descriptive languages. The first step in realizing a chip generator must be to create a framework for making generators.

A chip generator according to an embodiment of the present invention embeds designer knowledge into modules by enabling the interleaving of a software scripting language (Perl) and a hardware descriptive language (Verilog). The chip generator according to an embodiment of the present invention has a collection of features that make it powerful for creating generators: (a) the chip generator according to an embodiment of the present invention pulls much of the parameterization from the hardware language scope to the hardware generator scope. (b) the chip generator according to an embodiment of the present invention has hierarchical scope (rather than the file based scope of most other preprocessors). This also enables generation of heterogeneous systems by doing automatic uniquification of generated modules and instances. (c) the chip generator according to an embodiment of the present invention constructs/uses a hierarchical XML representation of the entire design data base, which lays down the API for application engineers to program the generator, or for optimization tools to search the design space. (d) the chip generator according to an embodiment of the present invention has a foundation in a complete and known software language (Perl) that enables the designer to embed his thoughts by explicitly controlling the hardware elaboration. Moreover, it enables the design modules to generate some of the collateral files needed for validation, physical implementation and/or software development.

A chip generator according to an embodiment of the present invention makes it straightforward for a designer to create an elaboration program that can generate custom, heterogeneous hardware based on a user's input. But design is just part of the problem. As important is the verification problem, accounting for 30%-70% of today's chip design NRE costs. The difficulties that a chip generator may inflict on RTL verification will be discussed. Since one design is hard to verify, the verification problem can be expected to get worse with a chip generator approach because flexible designs increase the validation space. Our validation goal is not to validate the generator but the particular design that it generates. This means that the validation space for each instance is in fact constrained, and is no worse than an equivalent instance that was not auto-generated. The key challenge is to ensure that the generator validation collateral can be reused to generate the test environment needed for each instance.

Creating a Generator: Embedding the Hardware Designer's Knowledge

In its essence, the chip generator provides an application designer the ability to control the hardware substrate on which his/her application is going to be computed. As an example, an application designer may decide that one storage element in the architecture template is to be used as a private cache, another as a shared cache and a third as local scratch pad. Similarly, the application designer may decide to add some custom functional unit to a processing element to improve the efficiency of a calculation. In addition, after higher level architectural knobs have been set, an optimization script may be used to automatically make some of the lower level design decisions. For example, these lower level decisions might include size and associativity of the aforementioned caches or the width of that functional unit. Notably, an implicit assumption here is that the system can accept such late, high level changes, and generate the appropriate hardware with minimal or no manual intervention.

An "architectural template" approach is discussed in which the skeleton is set, but the components are flexible—subject to the application designer and optimization tools creativity.

It is important to note that in this approach many of the design decisions must be left unassigned or parameterized until a later stage in the process where the application engineers set them. This process, sometimes called "late binding" of design decisions and parameters, comes in contrast to current approaches where the design exploration and optimization has been fixed and hard-coded up front by the hardware architects and hardware designers.

Late binding of design parameters implies that at design time the hardware designer does not know the exact value of parameters, and must embed instructions—an "elaboration program"—that encode the impact of each parameter on the construction of the system. To give a concrete examples of the level of parameterization required, a discussion below examines the architecture of a couple of typical structures in a chip multiprocessor. Parameters can be classified into three main groups: architectural parameters, free/optimization parameters, and constrained/inherited parameters. The implication of these parameter classes is examined on making a late-bindable, optimizable generator, that can take a homogeneous flexible component and create a heterogeneous result.

Below, a chip generator according to an embodiment of the present invention is also discussed that facilitates the construction of generators by enabling hardware designers to encode elaboration instructions with complete software-like capabilities. An embodiment of the present invention enables designers to code in two languages simultaneously and interleaved. One language describes the hardware proper (Verilog; synthesizable), and the other one decides what hardware to generate (Perl; evaluated at elaboration). C++ programmers might recognize this as being similar to the use of the main C++ language to describe an algorithm, interleaved with C++ templates meta-programming to describe late binding of types, constants or functions to specific parameters within the algorithm.

A premise of a chip generator according to an embodiment of the present invention is that during elaboration time everything is allowed and everything is possible. A chip generator according to an embodiment of the present invention pulls out parameterization functionality from the underlying language (typically Verilog). It then takes charge of the construction of the entire hierarchy and of module uniquification, which will be discussed later. By using the chip generator according to an embodiment of the present invention instead of coding specific modules, hardware designers are coding instructions for how these modules need to be generated given a set of (external) application specific input parameters. At elaboration time, whenever a module is instantiated, the interleaved elaboration program constructs the required hardware module.

Architectural Templates and Design Parameters

The term architectural template is used as a venue for the codification of expert knowledge and trade-offs in a certain domain. A templated architecture describes a family of chips that target different applications and/or have different performance and power constraints. In many ways, for the user of the generator—that is, the application designer—programming this template is similar to configuring an architectural simulator such as M5 or SimpleScalar because, in both cases, the underlying framework defines a set of knobs for the user to configure.

Figure 2:
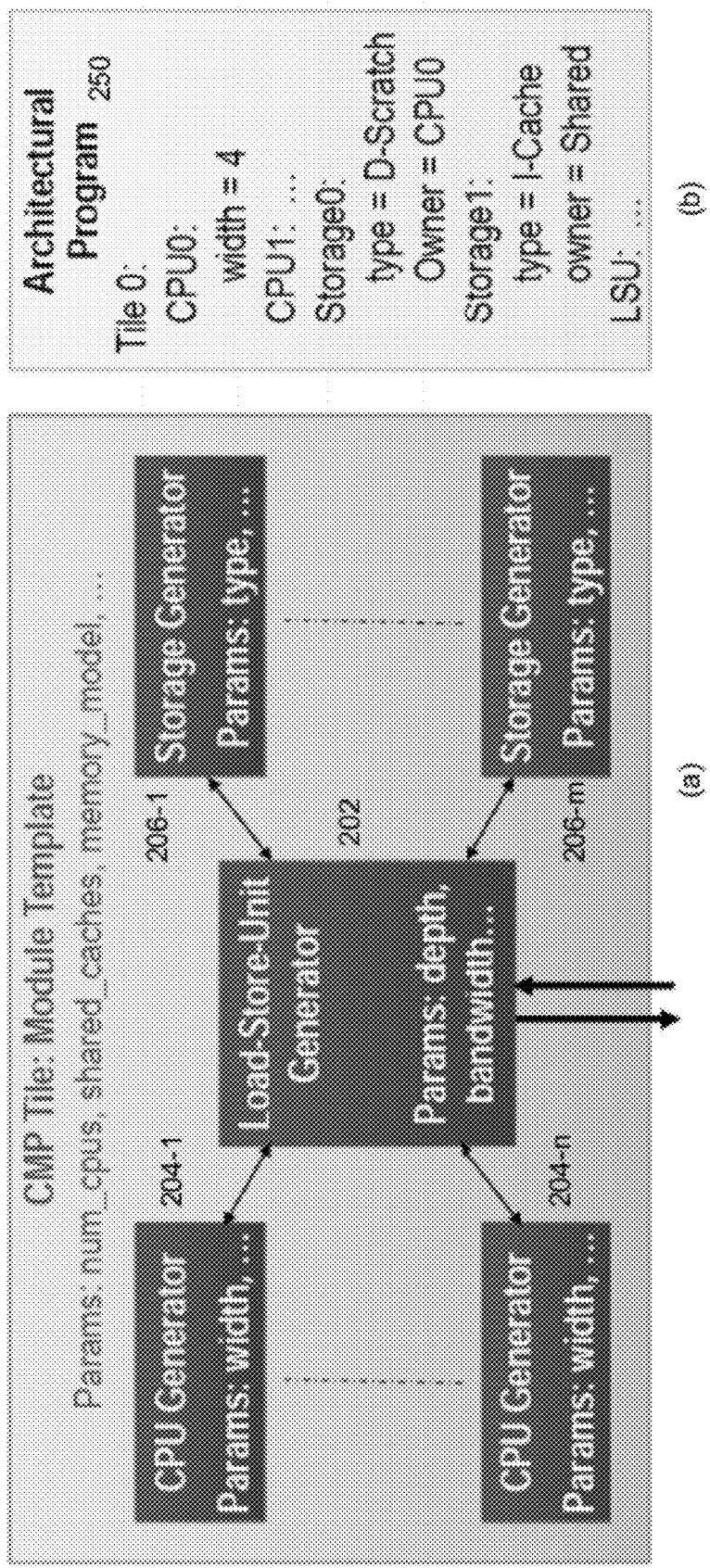
FIG. 2 is an example of an architectural template for a tile generator according to an embodiment of the present invention.

FIG. 2 shows an example template for what could be a tile in a chip multiprocessor generator. FIG. 2(a) illustrates that components are placed and interconnected to form a rigid structure for that architecture. For example as shown in FIG. 2(a), Load-Store-Unit Generator 202 is interconnected with CPU Generators 204-1 through 204-n and Storage Generators 206-1 through 206-m. Also shown is how at each level of the template hierarchy, certain "knobs" or parameters have been left for the application designer to determine. In the diagram shown here, the tile level parameters include, for example, the number of CPUs, n, to be included in the tile as well as the number of storage generators, m. It also shows that once each number is set, each processor, for example, can be configured at the next lower level of the hierarchy according to predefined parameters (e.g., width, bandwidth, type, etc.) that impact the architecture of such processor. Furthermore each processor configuration may result in completely different processor hardware. A similar approach can be used for the m Storage Generators as shown in FIG. 2(a)

FIG. 2(b) shows how configuring the generator is done using an architectural program 250 according to an embodiment of the present invention. In its essence, the configuration is done by the user hierarchically specifying the value for the architectural knobs. In some cases, the application designer may not desire to specify the exact value of a knob but may instead leave it to an optimization procedure to determine (e.g., an application designer may desire a cache but may want to leave the cache size for the optimizer to determine). In an embodiment of the present invention, optimization can be done at the system level.

While there are many ways for a user to specify hierarchical input, an XML configuration file was chosen for an embodiment as the delivery media, for its simplicity along with the rich library support for creating, manipulating and parsing XML documents in the software languages. This guarantees straightforward and standardized interfacing with other tools.

The use of a flexible, yet constrained template for an architecture, one that at every level of the hierarchy fixes the connectivity and type of blocks allowed, comes in contrast to existing methodologies of piecing together any set of IP blocks in (almost) any configuration—a methodology that is often referred to as system-on-chip (SoC), or Core-Connect. The template approach is closer in concept to the platform-based, or gross grain reconfigurable design methodologies, that advocate a single, yet flexible, design to make both verification and software simpler. The reason that logic verification and software becomes easier for the platform based approaches is that the key interfaces and properties of the architecture are the same for almost all configurations and enable amortization of the software and verification development effort. The difference between a template design and a platform or reconfigurable design is merely the amount of resources and the time and method at which the design parameters are bound: Platform based designs have a rigid template with a fixed amount of fixed-function/processing resources. An application can be mapped to the platform, but resources cannot be added or removed (e.g., add a processor, remove unused memories, increase bandwidth on a bus, etc.). If the application mapping is moved to a pre-silicon stage, these customization (and more) become possible. In much the same way, while reconfigurable designs enable post-silicon runtime software configuration, a template enables pre-silicon configuration so that the final silicon could potentially be further customized, and much more energy and area efficient (since the configuration overhead is not taped-out).

Figure 3:
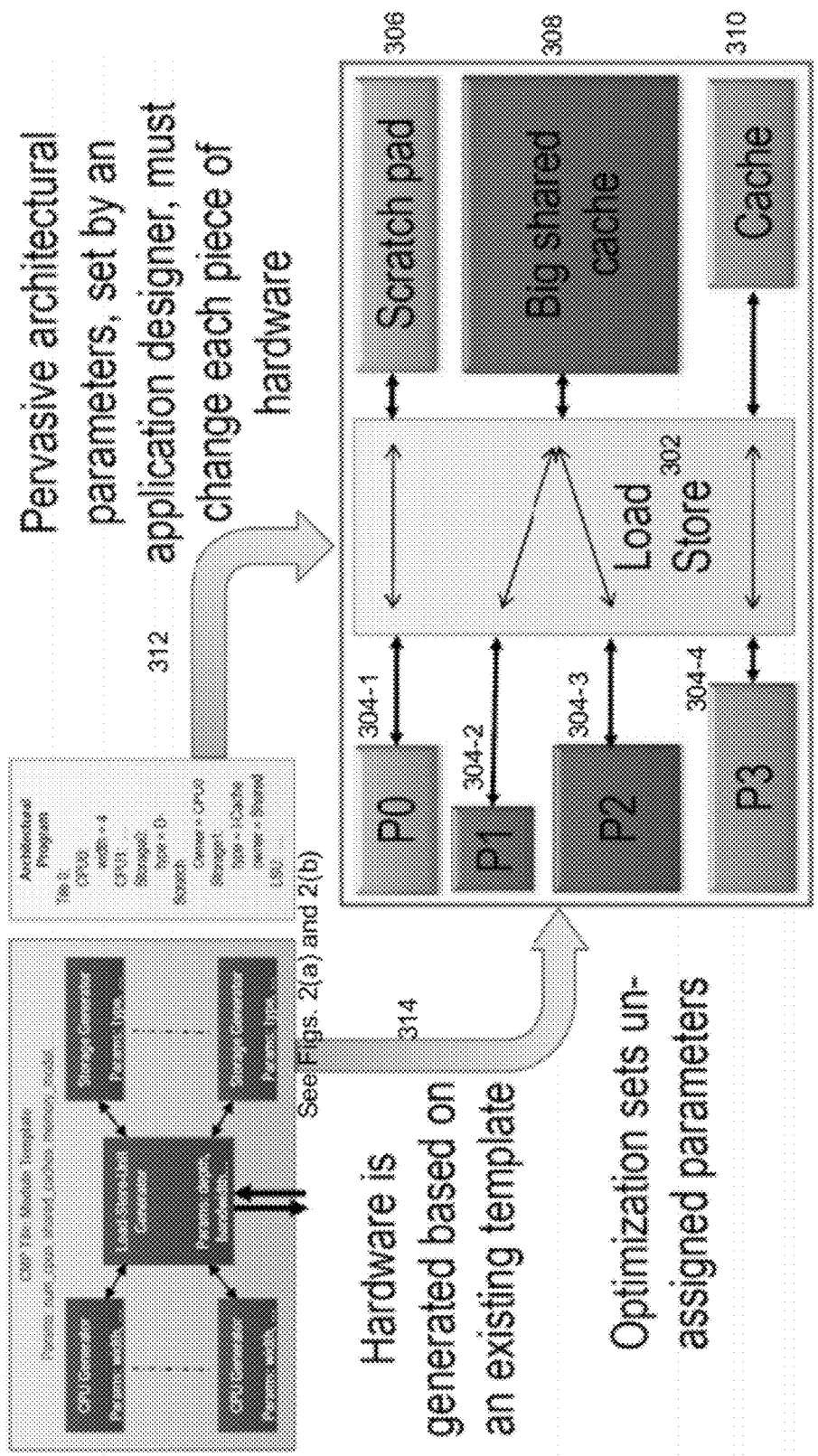
FIG. 3 is an illustration of the process for converting an architectural template according to an embodiment of the present invention.

The problem, however, as illustrated in FIG. 3, then comes in creating a representation 300, or an encoding, of a template such that it can later on be compiled into final RTL. In particular, two issues must be addressed. First, since the user who "programs" the template is an application designer and not a hardware designer, the mechanism that transforms a template to a design must provide a means for that application designer to pervasively control the internal "knobs" as represented by arrow 312 that extends from FIG. 2(b) to representation 300. It is important to note that the hardware designer need not be part of the process at this point, so any implication of a knob-change on the system must be addressed automatically. Secondly, since, in addition to architectural knobs, oftentimes there are many low level design decisions to make and, since the goal of a generator is to produce efficient hardware, that mechanism must also provide a (standardized) way for optimization tools to set these lower level design decisions as shown by arrow 314 that extends from FIG. 2(a) to representation 300. For illustrative purposes, representation 300 is shown as including Load Store 302, P0 304-1, P1 304-2, P2 304-3, P3 304-4, Scratch Pad 306, Big Shared Cache 308, and Cache 310. Other embodiments for representation 300 are possible as is known to those of ordinary skill in the art.

Figure 4:
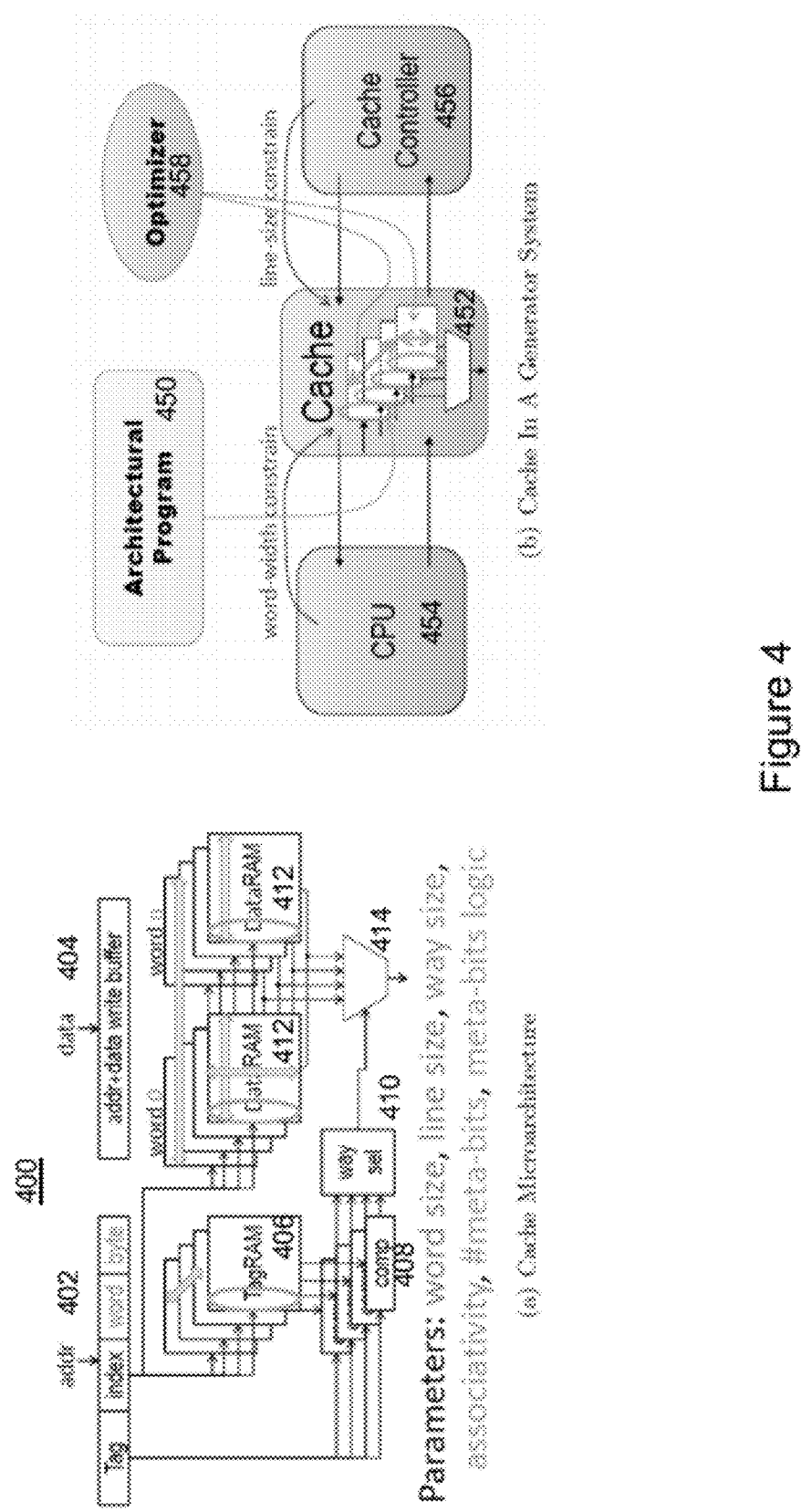
FIG. 4 is an illustration of the sources and impacts of parameters on a cache microarchitecture design according to an embodiment of the present invention.

To better understand the different mechanisms needed to resolve design parameters, a more concrete architectural template is shown in FIG. 4. FIG. 4(a) shows a schematic view of cache 400 that is to be designed to handle address 402 and data 404. Cache 400 includes, among other things, TagRAM 406, comps 408, way select 410, dataRAM 412, and mux 414. FIG. 4(a) enumerates some of the design decisions that would have to be made in order to implement the module. Parameters that may be implemented in the design of cache 400 includes word size, line size, way size, associativity, number of meta-bits, and meta-bits logic among other things. FIG. 4(b) takes a step back and looks at that same cache but this time inside a system to better understand where the origin of the design decisions. For example, as shown in FIG. 4(b) an architectural program 450 considers cache 452 in the context of operating in conjunction with CPU 454 so as to determine word-width constraints among other things. Architectural program 450 further considers cache 452 operating in conjunction with cache controller 456 so as to determine line size constraints, for example. Also, Optimizer 458 seeks to optimize the various parameters so as to achieve a better performing cache 452.

Here, the parameters can be classified into three groups. The first group, inherited/constrained parameters, is design parameters that even though they have significant impact on the design (which may take the form of logic, area, power, performance, interface signals etc.) are not really inherent parameters of that module—their value is constrained by, or inherited from, decisions that were made elsewhere in the system. Examples of inherited parameters include the word width and the line size of the cache. This means that had the application designer decided to use a single-instruction-multiple-data (SIMD) processor instead of a single word processor the generator system would have to adjust not only the processor but also the cache that connects to that processor. Setting the cache-controller bandwidth would also have a similar effect where not only the cache controller changes but also the inherited parameters of the associated cache. Note again that this does not mean that all caches in the system change, just the cache instance connected to that processor or cache controller instance.

The second type of parameter is the free parameter. These are parameters that (at a given level of the hierarchy) can be freely assigned—they would not change the functionality of the system, only the area, power, and performance, for example. Once the free parameters are set, their value may propagate to other modules in the design as constraints (e.g. setting the free parameter 'way-size' at the cache level is likely to propagate to each of the way instances as an inherited parameter). Nevertheless, because the system is "free" to assign any value to the free parameters, the best option is probably to simply let the optimization tool pick the right value that would maximize performance under a given power or area constraint.

The third type of parameter is the architectural parameter. These are decisions that once made, are going to impact the functionality of the module.

As an example, in FIG. 4(a), the meta-data bits are considered that are often associated with cache structures, to keep the state of the line (e.g., Valid and Dirty bits in a single processor system, Modified/Exclusive/Shared/Invalid in a chip-multiprocessor that implements a MESI protocol for coherence, Speculatively Read/Speculatively Written in a chip-multiprocessor that implements transactional memory model, etc.). By setting the number and functionality of these meta-data bits, the architecture of the system changes. Table 1 summarizes the type of parameters, their impact, and the source of their assigned value.

TABLE 1

Sources and impact of parameters on a cache microarchitecture design

| Parameter Name | Impacts | Parameter Source |
|---|---|---|
| Word-size | Memory block width, decoding of address vector, processor side interface width | Constrained/inherited (requires information from the relevant CPU instance) |

TABLE 1-continued

Sources and impact of parameters on a cache microarchitecture design

| Parameter Name | Impacts | Parameter Source |
|---|---|---|
| Line-size | Number of memory blocks, decoding of address vector, cache controller interface width | Constrained/inherited (requires information from the relevant cache controller instance) |
| Way-size | Size of memory blocks | Free (optimization → requires late binding) |
| Associativity | Number of memory blocks | Free (optimization → requires late binding) |
| Meta-data bits | Line state, cache protocol (e.g., coherence) | Architectural (set-by-user → requires late binding) |

In examining the cache design example presented in FIG. 4, design parameters of various blocks are shown to be closely related and constrained or inherited. Any single module (like in the example above) may need to inherit parameters from multiple various modules. The constraining parameters may come from modules which are at the same branch and level of the design hierarchy, like the module holding the constrained parameters in the cache example. But the constraining parameters may also be in a module higher in the hierarchy (e.g., way-size at the cache level would constrain parameters inside each cache-way instance). Similarly, the constraining parameters may come from a module lower in the hierarchy (e.g., a processor may or may not need to implement a configuration bus interface, depending on whether a register file module inside it requires such an interface). There may even be cases for which the constraining parameters' module is in a completely different branch of the hierarchy. One example would be in the design of TX and RX communication between different sections of a chip.

The fact that parameters in various modules may have dependencies brings up an interesting issue—it means that both instance and system scoping are important: unless the execution of the elaboration code captured in the template is associated with a particular instance (not just a particular generated module), and unless it has access to the complete system scope (e.g., can reference to other instances), it will not be able to "query" values of parameters in other instances in a system. If the elaboration program of one instance cannot "peek" into parameters of other instances in the system, it may not be able to resolve many constraints on its parameters.

A second issue that must be addressed arises from the fact that the elaborated module type heavily depends on external input, whether it comes from optimization tools or human users. Borrowing a term from object oriented programming, this is the problem referred to as late-binding, dynamic-binding or name-binding of an object type to an identifier in the program code. There is a class of programming languages in which types evolve during the execution of the program. These are the languages that, like object oriented languages, use a subtyping relation. It is meaningful to differentiate at least two distinct disciplines of selection:
  1. The selection is based on minimal information: The types of the arguments at compile time are used. We call this discipline early binding.
  2. The selection is based on maximal information: The types of the results of the arguments are used. We call this discipline late binding.

Traditional RTL coding is much like early or static binding in software—almost all decisions are made up-front and lots of effort is spent coding it. Late-binding in an RTL context, would indicate a process that comes along at elaboration time, and makes important changes specific to a particular instance, based on external input.

Figure 5:
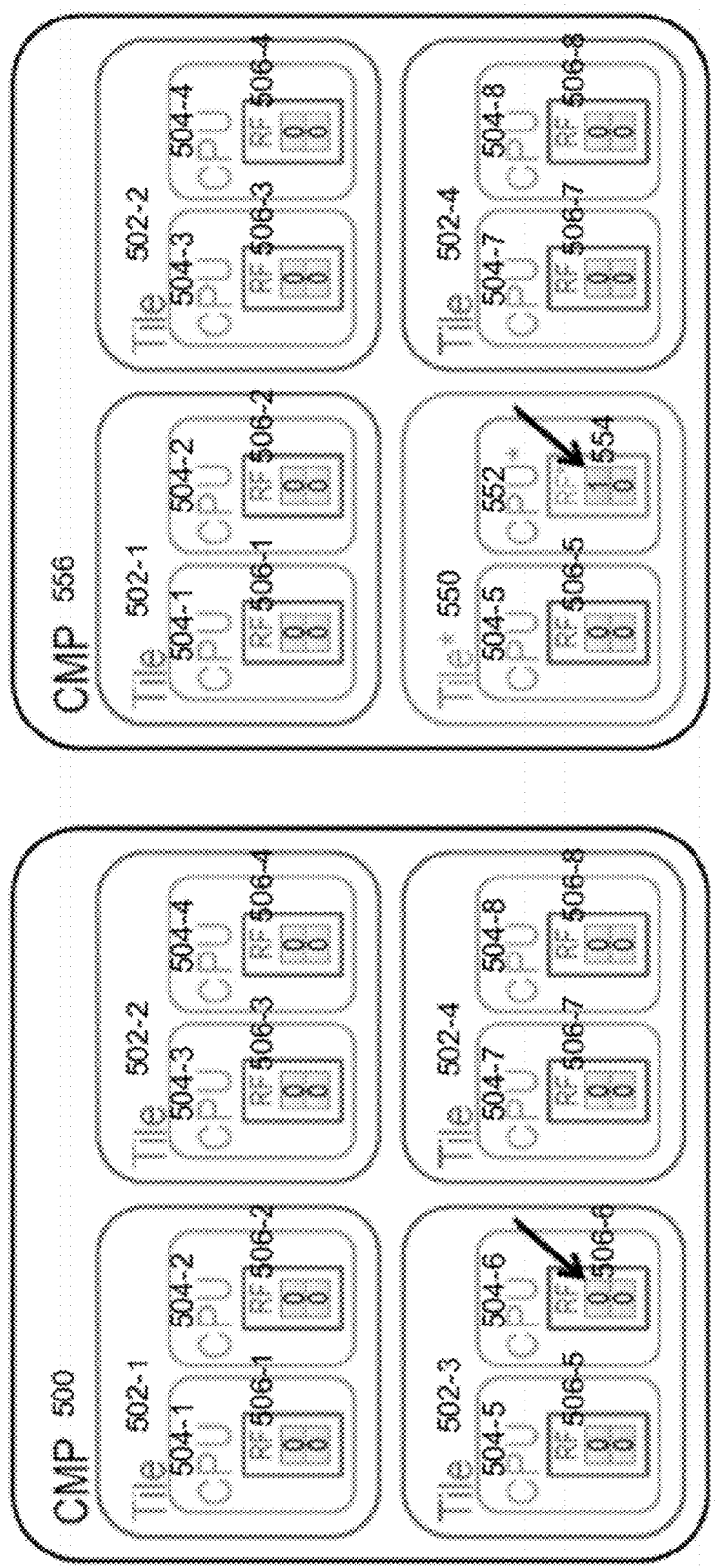
FIG. 5 is an illustration of late binding and its impact on module uniquification according to an embodiment of the present invention.

To get a better feel of how late-binding impacts design elaboration, an example is shown in FIG. 5. FIG. 5(a) is a homogeneous template view of a chip multiprocessor system. In this example, a change, driven by an application designer, in a late binding process that would affect the elaboration result is examined. The late decision here is to change the default value of one of the registers (506-6) in one (CPU 504-6) of eight processors (506) within four tiles 502 in a multiprocessor system 500. In fact, this is a common dilemma in CMP design, since many times at power-up, designers want one processor to "wake up" so that such processor can operate to configure the rest of the system.

If the application designer's input program requires a change in the default value of that instance of register 506-6, FIG. 5(b) shows how this register has to be uniquified. This causes a chain reaction that uniquifies not only that register but also its register file (which has to be "different" in order to instantiate a different register than those in the other register files), the processor that instantiates the "different" register file, and the tile that instantiates the "different" processor. As shown in FIG. 5(b), that small change would require that at elaboration, such register becomes unique (uniquified), and so does the entire hierarchy on top of it. For example, a result can be that there is a unique register 554 that results in a unique CPU 552 that results in a unique Tile 550.

There is a need for a design framework that enables designers to embed their knowledge of the system in a system template. Then, it needs to be able to accept external users' and tools' input, and use that template to generate the heterogeneous design instances. The analysis above demonstrates that creating the tool, the design framework, requires the following:
  1. Rich(er) programming environment for the elaboration phase—This requirement is straightforward since elaboration is the equivalent of an object oriented language's constructor mechanism, essentially telling which modules need to be instantiated and how they need to be interconnected. This comes in contrast to the functionality description, that is the part of the hardware descriptive language that must be synthesizable.
  2. Instance and system based scopes—In its essence this requirement is the same as the default scoping used in object oriented languages. It means that the run of the elaboration program generates an instance of a module, not a module. Moreover, that instance, during its construction, is "aware" of its position in the system, and can obtain pointers or references to other instances (in order to satisfy parameters' constraints for example).
  3. Elaboration with I/O—This requires some standardized way of external input/output interaction with the embedded elaboration program, while any aspect of late binding and uniquification need to be handled automatically. Without compliance to this requirement, the separation of hardware designer (embedding design instructions for the system) vs. application designer/tools (providing application specific input), cannot be achieved.

Approaches To Hardware Descriptive Languages

No single existing tool meets our requirements. For example, VHDL and Verilog are useful for describing hardware—once a designer knows exactly how the module they create needs to perform, it is easily described. This process, however, does not adequately embed the designer knowledge into the design, and any slight deviation requires significant recoding. To ease this problem, both VHDL, Verilog (post 2001) and System Verilog use elaboration time parameters and generate blocks to enable more code reuse. Generate blocks enable the designer to write elaboration programs for which parameters are the input and hardware components are the output. These programs are limited to if, case and for-loop statement's. No variables are allowed except for the very restricted genvar, and no advanced programming techniques such as classes or even IO reads/writes are possible during elaboration. Here, genvar declares a variable that can be used as the iterator of a for-loop in a generate block. It cannot be assigned to a value by user code or in any other way but the for-loop declaration. Also, IO reads and writes are allowed in RTL simulation but not at the time of elaboration.

To enrich a hardware descriptive language's programming capabilities for elaboration, many companies use pre-processors to generate RTL code. Naming just a few examples, these include the native Verilog pre-processor, C/C++ pre-processor, EP3, deperlify, EmPy, Tensilica TIE pre-processor, etc., as well as in-house scripts developed by individuals in many industrial design teams. While the programming language and the mechanism of implementation vary from one tool to the other, the concept is the same: Regular Verilog or VHDL are coded but are also instrumented with pre-processor directives, marked with special escape characters. Upon compile time of the code, each file is first pre-processed—the embedded pre-processor directives are evaluated—to create a new text file. The new text file is the input to the HDL compiler. Pre-processing is a solution to a very big problem since it artificially adds an explicit elaboration phase, and then significantly enriches the elaboration language. In the requirement list, it solves requirement 1 (above) and could potentially be used to solve requirement 3 (above). But pre-processors have a file-based in-compilation-order scope. Moreover, the elaboration program does not generate instances but modules because it is text-based and unaware of the hierarchical, object-oriented structure of the hardware that it is being used to describe.

Bluespec, which is a recent HDL, takes a completely different approach. For once, it changes the HDL software paradigm to a functional one—initial releases of Blue-spec compiler essentially provided a front end for a Haskell back end. The aspect of Bluespec that provides an advantage over HDL's such as System Verilog or VHDL, is in the higher level description of the hardware, which is then translated via Term Rewriting System (TRS) to either Verilog for synthesis or C++ for simulation. Bluespec provides benefits in the ability of designers to describe the hardware. Notably its ability to parameterize modules by value or type, or even by function or module (meaning that if module X internally uses function F or instantiates module Y, then module X can be parameterized such that F and/or Y are its parameters) constitutes a great advance in comparison to VHDL and System Verilog parameterization. The use of variables during elaboration (while trivial) is another advantage over the aforementioned restricted genvars.

There are barriers that keep Bluespec from becoming the best method for making a generator. One subtle but important such barrier is that numerical values can flow from the type domain to the value domain but not vice versa. For example, the number 5 can be declared as a size type using typedef 5 my five t, and if a value that corresponds to that size type is desired, there is a special pseudo-function, valueof, that takes a size type and gives the corresponding Integer value. The other way around is not possible meaning that if an integer is defined Integer width=5, width cannot be used for making new types (e.g. creating a register of Bit#(width) would produce an error). This limitation, though seemingly subtle, is important to our goal of embedding hardware designers' knowledge of how an instance of a module needs to be constructed—knowledge that often includes how internal types need to be defined. Our goal in the generator is for the application designer to assign values to high level architectural knobs, and have the system underneath compile that into both types and values, as needed. For example, if a user (or optimization tool) specifies that a cache must have four ways, it would change not only the number of ways (e.g., using the value of 4) but also the controlling signal widths (e.g., using the type 4). Similarly, it turns out that describing even a flip-flop based register file template, with N (N is a parameter) registers of widths $\{W_1, W_2, \ldots, W_N\}$ is not as trivial as may be initially thought.

Bluespec users often work around type vs. value issues by adding dummy type variables to interface arguments. One way to code the register file mentioned above is to add dummy type variables for each of the register widths. Unfortunately since these types are completely unrestricted the compiler needs provisos to impose meaning onto them. This, in turn, often leads to complex proviso statements, as the Bluespec compiler cannot prove complex arithmetic (for example that $K*3=K+K+K$). Another way to overcome type vs. value limitations is to use pre-processor directives, since these textual-based replacements can serve as both type and value. This is a return to the compilation unit and scope issues described for other pre-processors above.

A key issue that Bluespec does not yet solve over the older and prevalent HDL's is that the elaboration code is still restricted by synthesizability rules. In reality, there is no actual reason why during elaboration full software capabilities (e.g. dynamically allocating a structure, or spanning a process to determine the optimal architecture for a particular multiplier, or dynamic/late construction of types) could not be unleashed. As shown below, decoupling the elaboration part of the HDL from the functional part actually provides many benefits.

Embedding Designers Knowledge

Figure 6:
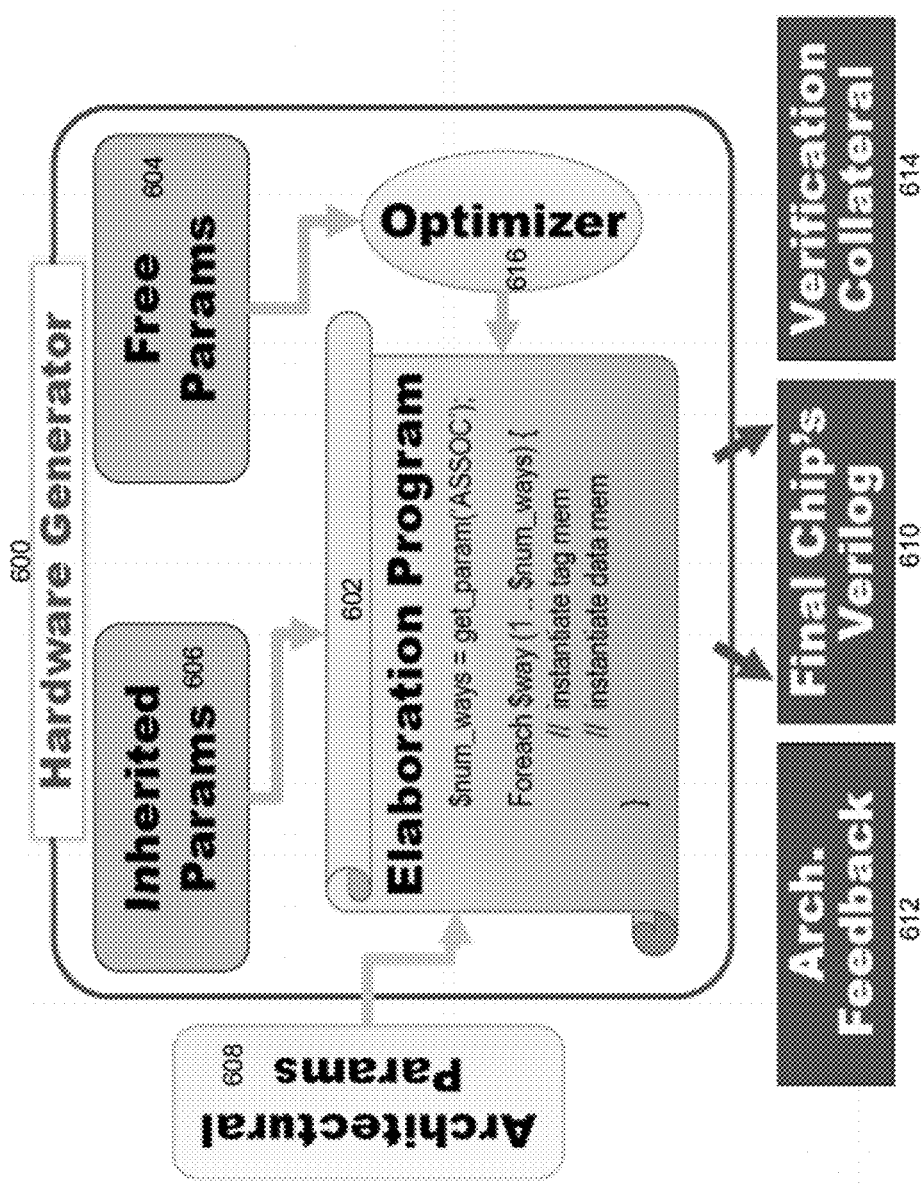
FIG. 6 is an illustration of a conceptual hardware generator according to an embodiment of the present invention.

Certain things a tool desirably needs to support for encoding a chip-generator—one that encapsulates the hardware designer's knowledge—were discussed above. FIG. 6 illustrates conceptual view of a Hardware Generator 600 that meets these requirements. FIG. 6 depicts a central elaboration program 602 that can use software constructs in addition to synthesizable code. The inputs to elaboration program 602 are various types of parameters: parameters 604 that are "free" for optimization, parameters 606 that are "inherited" or "constrained" by other parts of the system, and most importantly, architectural parameters 608 that an external user—an application designer—sets to get a customized system for his/her application. The hardware generator output is the elaborated system including Verilog 610 and Verification Collateral 614, as well as architectural feedback 612 for the application designer regarding elaboration "decisions" that elaboration program 602 made.

Rather than coding a specific module, hardware designers would use a rich, software-like language to write instructions for how modules are to be generated, given a set of input parameters that come from multiple sources. This code constitutes a template for creating the module. When the elaboration code evaluates, some of the parameter values are extracted from the hierarchical architectural description, others are forced by the instantiating parent template (like in System Verilog) or read from any of the other objects (e.g., instances of templates) in the system, and a third group is simply calculated (e.g., locally optimized). The elaboration program may also hierarchically instantiate other templates, or recursively instantiate a different instance of the same template. When sub-instances are created, the elaboration program can force parameter values into those instances (like in System Verilog) and/or read out any of these instances' parameters after they were generated. In other words, designers write how each particular block in the system is to be constructed, with respect to other blocks in the system. Aggregated together, these elaboration programs describe how the system is constructed based on application designers' input.

Leveraging the synthesizability of Verilog and the programmability of Perl, and adding an object oriented scope and hierarchical elaboration, a chip generator according to an embodiment of the present invention is created as described herein.

In terms of programming paradigm, the goal of the chip generator according to an embodiment of the present invention is to create an object oriented constructor-like mechanism, that will be used to generate elaborated instances of templates. One difficulty is that in software coding, there is no difference between the coding of constructors and instantiators of classes, and the coding of the class functionality. In hardware on the other hand, the description of the functionality of a module must obey strict rules of synthesizability. As a result, design languages also enforce strict rules on the construction and instantiation program—the elaboration step.

The chip generator according to an embodiment of the present invention aims to break this artificial limitation. It does that by enabling a designer to code in two languages simultaneously and interleaved: One that describes the hardware proper, and one that decides what hardware to use for a given instance. The premise of a chip generator according to an embodiment of the present invention is that during elaboration time everything is allowed and everything is possible. As an extreme example, given that the parameters for an instruction cache specify a 16 KB capacity, for example, a small program can be embedded to figure out what is the optimal associativity for a particular target application.

A solution that simply uses software constructors for hardware modules is also problematic because once created, a hardware module is a static entity, whereas a software class is dynamic—it can have members and pointers, and those could be assigned with different values and objects for every instance of that class. To enable this constructor-like mechanism in hardware, another known concept is leveraged from the software world—meta-programming using templates. In C++, instead of coding classes, programmers can code templates for those classes, leaving the binding of types to a later, compilation time, stage. A meta-program is generally a program that generates or manipulates program code.

The chip generator according to an embodiment of the present invention enables designers to create module templates rather than modules. Conceptually, by coding templates (whether in C++ or the chip generator according to an embodiment of the present invention) a meta-language is used to generate an elaborated instance of a target-language. Put differently, the output of a program-run of the meta-language is valid code for the target-language.

The high-level programming concepts of the chip generator according to an embodiment of the present invention will be discussed below.

Elaboration Order and Scope

As mentioned before, the chip generator according to an embodiment of the present invention generates a system rather than a module. Much like other HDL's such as Verilog/VHDL (and unlike pre-processors), there is great importance to the hierarchical structure of the design, and the generation order.

In an embodiment of the present invention hard-coded modules (analogous to software structures in C) are replaced with templates that each contain an elaboration program (analogous to templated classes with constructors in C++). Software can keep adding/changing/removing new instances of classes at run time, while in hardware, once when something is created, it cannot be changed. Caution needs to be applied with the programming paradigm. After the run of the "constructor," the created entity must remain static. To stretch the C++ analogy, this would be as if all members of the class were assigned by a constructor but can never change again. Somewhat similar to the type binding of C++ templates.

To make sure that instance B, for example, does not change a previously created instance A, the parameterization information of each template is read-only for the rest of the system. Further below is a discussion about how these template parameters can be assigned with values before the instance is generated. As mentioned above, during generation, the elaboration program can "read" parameters from other modules that were already generated. After generation, that instance cannot be modified again. This paradigm gives the decision-making power for how a particular instance needs to be generated, given the external input and given the surrounding system, to the designer of a template. It gives no power to other template's program to tweak that instance. This hard separation of one template's elaboration program from others is crucial for enabling designers and elaboration tools to reason about what hardware needs to be generated. For example, in the System Verilog standard, this separation does not exist.

This approach requires that there be a deterministic order for generation, so that designers can reason about the flow of design decisions (e.g., if module A's parameters are constrained by module B's parameters, then B must be generated first, and the designer must have the ability to specify that). The chip generator according to an embodiment of the present invention starts generation from the top module's template, and then generates the entire design below it. Generation is done as a depth-first search of the hierarchy, which means that the meta-program in the top module's template would be first to be processed, until the first unique inst instantiation function call is encountered[5]. Then, the chip generator according to an embodiment of the present invention recursively turns to processing the template of the sub-instance which is being instantiated, before continuing the generation of the current template. This process repeats recursively, until the complete hierarchy is generated.

Behind the scenes, this depth-first-search (DFS) strategy also makes it straightforward to handle uniquification and late binding. Assume that the template T1 NAME is now being processed because of an instance at level N of the hierarchy.

1. If during this generation, no sub-instances are encountered (e.g., this is a leaf in the hierarchy graph), uniquification is straightforward because all that needs to be done is compare the module which was just now generated to other k−1 modules that were previously generated from this template.
    (a) If it is different from others, the new module is named T1 NAME k.
    (b) Otherwise, if it is identical to the $i^{th}$ (previously generated) module, the newly generated module is discarded and the system is informed that the generated module is T1 NAME i.

2. If during this generation, sub-instances are encountered (e.g., instances of level N+1), going depth-first means that these sub instances are first generated and uniquified before making uniquification decisions about the generated module for this instance. By the time T1 NAME is fully process, other sub-instances' types are resolved so uniquifying the newly generated module requires a shallow comparison to other k−1 modules that were previously generated from this template.
   (a) If it is different from all of them, the new module is named T1 NAME k.
   (b) Otherwise, if it is identical to the $i^{th}$ (previously generated) module, the newly generated module is discarded and the system is informed that the generated module is T1 NAME i.

During the depth-first-scan of the code, scoping rules are very similar to other object oriented languages. A new scope is opened every time a new instance of a template is being instantiated. This is done using the $NewObject=$self→unique inst(-SomeTemplateName, prmName=>prmValue); method call. Note that this is essentially the equivalent of the NewObject=new SomeClassName<SomeType>; template+constructor call in C++ template meta-programming. This means that in addition to having class members, a template for the chip generator according to an embodiment of the present invention uses parameters, which serve as input to the meta-program (constructor) run. Just like C++ templates, where this call would create a new class based on the SomeType argument, the chip generator according to an embodiment of the present invention creates a new module based on that meta-program run on the parameters input.

On the other hand, when module types are dynamically generated, a hardware designer that simply wants to instantiate an identical module/interface to one that already exists elsewhere in the design, might find him/herself going through the trouble of trying to generate an exact clone. Experience in System Verilog parameters shows that this can become quite a cumbersome task. It is especially difficult for code maintenance, since often more parameters are added to a template as the design matures, which may require manual updating of some instantiations. To solve this issue, in addition to unique inst, the $NewObject=$self→clone inst(OtherObject) is provided; mechanism for the chip generator according to an embodiment of the present invention, which is somewhat similar to typeof(OtherObject) NewObject=OtherObject→deepCopy( ); in some versions of C++[6]. Newobject is going to be an object of the exact same module type as OtherObject.

Regardless of how an object was generated, a handle to any previously generated (in DFS order) instances can be obtained by using the built-in methods get parent, get subinst, get instance path and get instance obj. In addition, because generated module types are late-bound, template designers may occasionally need to query the resulting type of their meta-program run. The chip generator according to an embodiment of the present invention provides for every object the built-in methods $module name=$self→get module name( ); and $inst name=$self→get instance name( ); (get module name is a somewhat similar mechanism to the C++ typeid).

In terms of the template coding style, unlike object-oriented programs, the entire meta-program is considered as part of the new module's "constructor" unless explicitly specified otherwise (for example using the Perl sub keyword subroutines/methods can be declared for that template). This deviation from the classic class, constructor and methods declarations style, is important for giving the hardware designers the feeling that they are still coding Verilog, and simply enhancing it with some meta-language constructs. In addition, for simplicity of implementation, the chip generator according to an embodiment of the present invention assumes that the template for TemplateName resides in the file TemplateName.vp. Furthermore, statements in that file are assumed to belong to that template scope. These simplifications and assumptions are closer in nature to object oriented Perl than to Verilog. Yet, since it is common practice in Verilog coding to put one module per file and to name the file exactly as the module, this simplification seems reasonable.

Parameterization Levels

Above, the discussion emphasized that one major benefit of a chip generator according to an embodiment of the present invention is that the template for the architecture is coded first, only to receive final binding of architectural and optimization parameters later. Also discussed was that parameters are the key input to the generation meta-language program. Current HDL languages generally do not accept external input during the elaboration phase. Moreover, there is no standardized way of interfacing design parameters with other tools such as design exploration/optimization or GUI's.

First, the levels and mechanisms of parameterization in System Verilog are analyzed to understand the current state of the art. As discussed further below, the chip generator according to an embodiment of the present invention builds on these concepts and attempts to improve on them. A quick analysis of parameterization in System Verilog, reveals that it has three levels of priorities or strengths for elaboration parameters' assignments:

1. A localparam or parameter must be declared and initialized with a default value inside the module to which it belongs. The initial value can be assigned directly, or it can be derived from other parameter/localparams, or it can be assigned using a constant function.
2. The value of parameters (but not the value of localparams) can be overruled during the instantiation of the module.
3. The value of parameters (but not the value of localparams) may also be altered by a defparam statement, from anywhere in the code. Note that the IEEE Std 1800-2009 definition of the defparam is considered as a cause for both design and tool errors, and is put on the deprecation list by the standard itself (see section C.4.1 of the IEEE Std 1800-2009).

This list is missing a way to control internal parameters (free and architectural parameters) from external input (e.g., change a particular cache's associativity). One solution—propagating low level parameters to the top module—can be cumbersome.

First, in a chip generator there are going to be MANY knobs. Second, it is not even possible to explicitly propagate the knobs since the existence of some of them depends on the value of others (for example, the existence of the parameter for the number of ALUs in processor #3 depends on the value of the parameter for number of processors).

Another direction that was considered was to use defparams: In this scheme, external tools would create a list of defparams to "configure" the system[8]. Unfortunately, defparams are in fact the Achilles heel of System Verilog's parameterization. As explained in Section C.4.1 of the standard:

"The defparam method of specifying the value of a parameter can be a source of design errors and can be an impediment to tool implementation due to its usage of hierarchical paths. The defparam statement does not provide a capability that cannot be done by another method that avoids these problems. Therefore, the defparam statement is on a deprecation list. In other words, a future revision of IEEE Std 1800 might not require support for this feature.

"A defparam statement can precede the instance to be modified, can follow the instance to be modified, can be at the end of the file that contains the instance to be modified, can be in a separate file from the instance to be modified, can modify parameters hierarchically that are in turn passed to other defparam statements to modify, and can modify the same parameter from two different defparam statements (with undefined results). Due to the many ways that a defparam can modify parameters, a System Verilog compiler cannot resolve the final parameter values for an instance until after all of the design files are compiled.

"Prior to IEEE Std 1364-2001, the only other method available to change the values of parameters on instantiated modules was to use implicit in-line parameter redefinition. This method uses #(parameter value) as part of the module instantiation. Implicit in-line parameter redefinition syntax requires that all parameters up to and including the parameter to be changed shall be placed in the correct order and shall be assigned values.

"IEEE Std 1364-2001 introduced explicit in-line parameter redefinition, in the form #(.parameter name(value)), as part of the module instantiation. This method, gives the capability to pass parameters by name in the instantiation, which supplies all of the necessary parameter information to the model in the instantiation itself.

"The practice of using defparam statements is highly discouraged. Engineers are encouraged to take advantage of the explicit in-line parameter redefinition capability."

The problem, as stated by the IEEE Standard, can be summarized as lack of definite and deterministic way to perform elaboration, a shortcoming that hurts both the hardware designers and the tool implementation. The chip generator according to an embodiment of the present invention solves this issue by defining a clear and definite order of generation. The DFS scan is in serial program order, much like software objects construction.

There is also a second issue that the IEEE Standard had not identified but can be as error-prone. Because the defparam statement is "stronger" than the instantiation assignment of parameters, an overriding of a parameter value inside a module can cause conflicts with its parent (the module that instantiated it) or with modules that interface with it. For example, consider a module that implements a hardware register and uses width=8 as a parameter. This module is assumed to be instantiated and width=8 is overridden with some new width=16 (e.g., the signal to be registered is of width 16). If an external definition, using the defparam construct, overrides width=16 with a width=12, then suddenly, a lint error is created. While this is a trivial example, it illustrates a significant problem: Inherited or constrained parameters must not be overridden by external statements. Put differently, assignments of parameters at instantiation should be at a higher priority than external assignment because the template designer consensually chose to bind these parameters to a specific value.

To enable better parameterization, the chip generator according to an embodiment of the present invention pulls parameters to the meta-language level and redefines the assignment priorities. First, and much like System Verilog, designers are enabled to define and give default values to parameters. Then, a mechanism is enabled for overwriting these values, from external configuration files (for example, it enables finding the best parameters values using an optimizer). Note that since the generation is on an instance by instance basis, the configuration file specifies the overridden parameter and its value on an instance by instance base.

Changing values from a configuration file is possible if that parameter is not already constrained inside the system. For example, when compatibility is required for interface bit-widths. In these cases, external input to parameters may not be allowed. Instead, the instantiating template's elaboration program can be expected to calculate these values and force them as input of the instantiated template's elaboration program. An embodiment of the present invention allows parameters to be assigned during instantiation (again, much like described above for System Verilog) and put this assignment at a higher priority than both the local definition and the external input.

Except for during instantiation, and unlike the defparam statements in system Verilog, one template instance cannot change parameters' of another. Extra means for passive communication between template instances are provided. A highest priority parameter, force param, is added as a mean for a module to declare and export a value/message to the world. The other side of that coin, $someVar=$anyObj→get param (prm name) enables any instance's meta-program to read parameters from any other instance that was previously generated, anywhere in the system.

Put together, the priorities of parameter assignments are redefined as follows:

1 Parameters can be declared and defined in the template to which they belong using the notation: $someVar=$self→define param(prm name=>prm val) (where someVar is the value prm val that was hashed by the name prm name. if prm val was pointer, then someVar is a deep copy of the structure pointed by prm val)

2 Parameter values which were defined using method 1, can be overruled by external input (provided in XML format).

3 Parameter values which were defined using methods 1 or 2 can be overruled by the instantiation call to the unique inst method.

4 Parameters can alternatively be declared and defined in the template for which they belong using the notation: $someVar=$self→force param(prm name=>prm val). In these cases, the parameter is non-mutable by any other technique. In fact, an attempt to override its value will result in an error. More than anything else, force param is used for instances to inform the system about some property they possess. For example, a memory block instance may declare its required address-bus width based on its size, which may have been set for a particular application by an optimization tool.

The introduction of design parameters into a module's template essentially defines an API for that module. In System Verilog for examples, this API can be used by the instantiator of that module. In a chip generator framework, parts of this API are desired to be driven externally—free parameters by an optimization tool, architectural parameters by an architect or application designer. For the API to be better defined, it is better if it also contained type information. That is, if each parameter had a clearly defined type. For example, in System Verilog, the default type for parameters is integer, but parameters can be declared with other types. Type information can also assist other automatic tools that connect through the configuration file. For example, a design space exploration tool would certainly need to "understand" what is the legal range of values for each parameter it can change.

The parameterization of the chip generator according to an embodiment of the present invention is typeless but may not be in other embodiments. Having no types for parameters is an implementation by-product of using Perl as the meta-language, and may certainly be seen as a shortcoming, since type checking is now delayed until generation is done and the resultant modules are compiled for simulation or synthesis. As a research platform that attempted to explore what language constructs are required for a generator, there is an advantage in typeless parameters since it allows for any type of parameter to be used: scalars, strings, arrays, hashes, subroutine names, template names, module names, instance references, etc.

In practice, since parameters serve as the input to the system, to the templates' meta-programs, it is highly recommended that each parameter value is tested in the template's meta-code, and that a $self→error("error message") is thrown if the value was found to be illegal, much like in good software programming practice.

The chip generator according to an embodiment of the present invention treats parameters as constants; if a re-definition of a parameter is attempted, the compiler of the chip generator according to an embodiment of the present invention signals it as an error. Combined with the DFS order of generation and the methods and priorities of declaring and assigning values to parameters, this makes parameter value assignment a fully deterministic process (lesson learned from the Verilog defparam statement). Because the chip generator according to an embodiment of the present invention enables the use of compound structures as parameters (e.g., a hash), there could still be a flaw if the internal values of these compound parameters could be modified by user code—it would break the read-only paradigm. The chip generator according to an embodiment of the present invention solves this issue by making any of the methods that return a parameter value or pointer, actually return a deep-copy of that parameter.

Interface

A key requirement for a generator is that hardware should be generated based on external input from an application designer, without the intervention of the hardware designer. While there can be many ways (e.g., comma-separated-values, binary files, etc.) and many formats for a configuration file containing the external input, a choice was made to standardize the configuration of the entire system to one data structure using XML format and a pre-defined schema.

The benefit of a standardized interface is obvious—it removes the burden of parsing the input files from the template designer. Instead, parsing is done by the chip generator according to an embodiment of the present invention so that the configuration file is read, parsed and its information binned to the appropriate instances' parameters, before the first line of the designer code is processed. Rather than just reading the input configuration file, the chip generator according to an embodiment of the present invention goes one more step and generates a complete description of the generated design, in much the same format as the input configuration file. In that feedback XML description, parameters which are bound at instantiation or forced by the elaboration program are put on a separate category of ImmutableParameters. On input XML files on the other hand, the entire ImmutableParameters element is not required and is in fact ignored. If a user wrongfully attempts to modify a bound or forced parameter by specifying it as a regular parameter, it is also ignored since external input has a lower priority than bound or forced priority.

Figure 7:
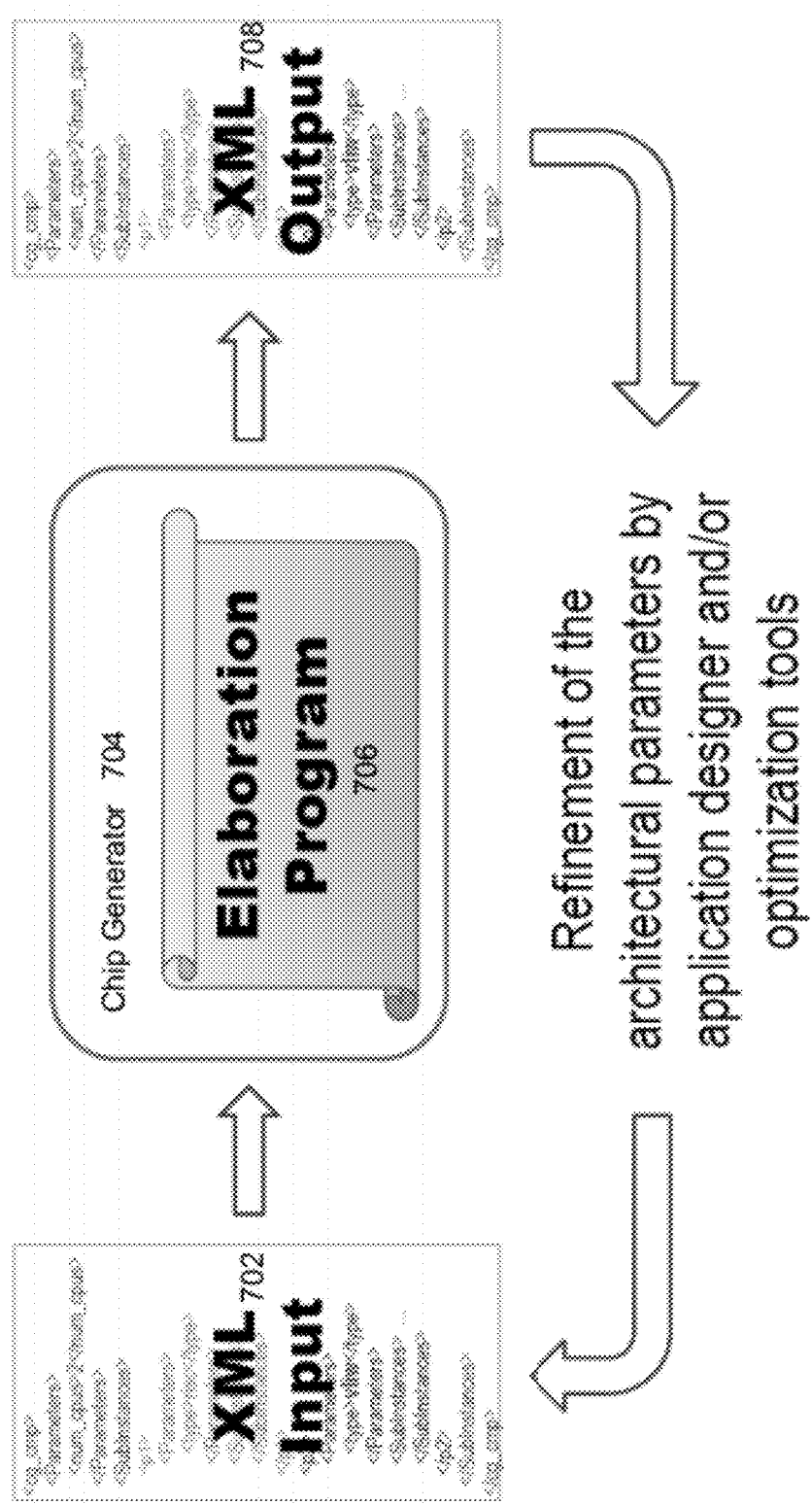
FIG. 7 is an illustration of an iterative process to customize a design according to an embodiment of the present invention.

FIG. 7 illustrate the process of iteratively customizing a system. As shown, the user/external tools assign values to internal "knobs" via XML Input 702. Chip Generator 704 through the use of Elaboration Program 706 generates hardware descriptions accordingly. When Chip Generator 704, according to an embodiment of the present invention, is used to generate hardware, it also generates a hierarchical description of the system. For each instance, this description can include the instance name, the uniquified module name, the name of the template from which this module was generated, and the entire parameter space for this instance. Chip Generator 704, according to an embodiment of the present invention, generates XML Output 708 of the hardware. The user or certain automated tools then refine the values of the internal knobs to meet the specification. Changing a parameter's value in the XML description and re-generating yields a new design, based on the modified value(s). A second, but as important, advantage is that, because the interface is well defined, the chip generator according to an embodiment of the present invention can work with other tools such as GUI's or optimization frameworks.

For example, to implement a graphical user interface (GUI) for a generator, parameters are set in their default state. The chip generator according to an embodiment of the present invention generates the design database but also a configuration file that represents that state. Once the user changes some parameter of some instance in the configuration file—for example change number of processors in a chip multiprocessor (CMP) from 2 to 3—the chip generator according to an embodiment of the present invention re-generates the new design and the configuration file. Since a new processor was added, our new configuration file now contains the entire parameterization of that instance and its sub-hierarchy. Our user can now modify that processor (e.g. change it to a VLIW processor), and once again, the chip generator according to an embodiment of the present invention will generate this, now heterogeneous, CMP. Manual customization by way of GUI can continue in this manner until the user is happy with the resultant CMP.

This example also illustrates the benefits of using XML for the representation of the architectural choices that were made: XML is a hierarchical and extensible representation by definition.

Capturing More of The Designers' Knowledge

When returning to consider one of the high level goals of the chip generator according to an embodiment of the present invention, and of a chip generator in general, it is to capture the designer knowledge so that the process of making next chip(s) is much easier and automated. The chip generator according to an embodiment of the present invention can be used to capture the hardware designer's knowledge with respect to the hardware that they intend to create. When the hardware designer knowledge is considered in the whole process of making a chip, it goes further than just the hardware RTL. For example, when a hardware designer designs a block, he/she may also have information, or clues, that can help the validation infrastructure.

This is one of the most important advantages of using a full software language for the description of the template. The mechanism is generally straightforward: when designers embed instructions that convert parameter input to Verilog HDL, they can use that same knowledge and these same parameters to create other files that can be used by the software stack, the verification test bench or the physical implementation. The following are three examples to illustrate cases at which the designer knowledge can be used beyond the hardware proper:

Software: Consider a template for a register file, parameterized by the number of registers and their sizes, as well as by the address space of these registers. To easily propagate the information to the software drivers, as the template's code generates the registers, it can also open and generate a C++ header file that would contain relevant information (e.g., addresses and default value for each register). Then, when an application developer decide to tweak values in this register file, perhaps even change its address mapping or some of the default values, the software development is not disturbed since a new header is generated with the new hardware.

Verification: Consider a template for a network switch, parameterized by the number of channels, virtual channels, message types etc. Similarly to the register file above, header files can be generated for verification modules to include. An even better way, is by leveraging the unified design-verification environment that System Verilog offers: Unlike an OpenVera or Specman environment that were compiled separately from the hardware HDL, in System Verilog, the verification components are an integral part of the hierarchy. As such, these verification components should be built as templates, and share the same scoping rules of the design. This means that, for example, a monitor template for the generated network switch can be instantiated with some of the parameters of the interface it observes (as part of the hierarchy it is instantiated using the chip generator according to an embodiment of the present invention unique inst method). Alternatively, it can also "peek" at these parameters using the built-in method get param.

Physical Implementation: Consider a template that is in-charge of generating the top level of some design, parameterized by the inputs and outputs names and widths. In terms of hardware, this template is likely to instantiate IO pad cells and boundary scan registers (BSR). Since the knowledge of the IO components is already captured in the template, there is a strong motivation for this template to create a secondary file, a TCL script, that describes the IO pad placement order for the downstream place-and-route tool. (Note that this template can also generate critical information about the boundary scan order for JTAG testing tools.)

Implementation

Implementing the chip generator according to an embodiment of the present invention Can be generally straightforward. Essentially, the chip generator according to an embodiment of the present invention adds a software language to the construction phase of a hardware language. One way to implement the chip generator according to an embodiment of the present invention could have been to pick a known HDL such as Verilog or VHDL and extend it. This would have required re-implementing a full software compiler in addition to the hardware compiler. Another way would be to use an already existing software tool and have it handle the software extensions of the HDL code. In the case of the chip generator according to an embodiment of the present invention, this would be the Perl interpreter.

An early embodiment of the chip generator according to an embodiment of the present invention was based on modifying EP3. In a nutshell, EP3 provides three main mechanisms for programmability: pre-defined directives such as @define or @macro; toggling between meta-(Perl) and target-(Verilog) language using the @perl begin/end directives; and extending/defining new directives. In this first version, a new directive @unique inst was added to the existing list of EP3 directives. The purpose of the unique inst directive was to make a recursive call to the EP3 pre-processing engine for an instantiated object. This recursive mechanism was enough for creating a per-instance scope since each new instance of the pre-processor could have its own parameter definition data structure. This enabled the generation of modules from templates on the fly, plus uniquification where needed. A globals list was also maintained—a list of global scope parameter definitions—for inter-instance message passing. To provide an XML based intermediate form, the EP3 data structure was augmented with pointers to parent and child instances, and had the unique inst function extract information from an XML file if one was provided. The piece that was missing was the ability of user code in an instance A to get a handle to a second instance B or to instance B's parameters.

A limitation to this implementation was in the limited number of directives that were implemented and in the complexity of adding more. In EP3, directives such as @define are not native Perl calls but actually calls to Perl functions that must implement that functionality (for example, the @define directive is a call to a function that puts a definition of name and value in the EP3 data structure). In order to support even the most common software construct, directives had to be implemented for @for/@foreach/@endfor, @while/@endwhile, @next, @break, and more. In addition, a "math" library of directives had to be created such as @add, @sub, @mul, @div, @ log 2 etc. Adding more and more software mechanisms as directives proved to be a tedious and endless task.

A second problem was that the EP3 engine is based on text replacements and not on terms evaluation like actual software languages, which made it close to impossible to compound function calls. For example, assume we set "@define A 1," "@define B 2" and "@define C 3." To implement D=A+B*C, "@mul B B C" needs to be calculated and only then "@add D A B." An attempt to call "@define D A+B*C" instead, would have resulted in the definition of D as the string "1+2*3." Similarly an attempt to call "@add D A (@mul B C)" would have resulted in an error.

An early embodiment of the present invention, which was based on the parsing engine of EP3, could be used to make chip generators with broader application. For example, in an embodiment, a Perl interpreter is used directly on the meta-language.

To create the chip generator according to an embodiment of the present invention, a mechanism much like that of TPP is assumed: a "//;" (two forward-slashes followed by a semicolon) indicates the start of a full meta-language (Perl) line, and "'expression'" (an expression placed between two grave accent signs) indicates an in-line toggling between meta- and target-language. The key is in the intermediate form that was generated. A page from the C compiler is taken, which first creates object files and then links them together. Our parsing engine first creates Perl classes, or packages, and generation of target-language code is done after the packages have been made. This means that the chip generator according to an embodiment of the present invention first parses the templates to create Perl packages. This parsing phase essentially creates the complete code for a fully object oriented program that generates hardware. To make this program "link" together, generated classes/packages inherit from one base class/package called UniqueModule.pm.

Figure 8:
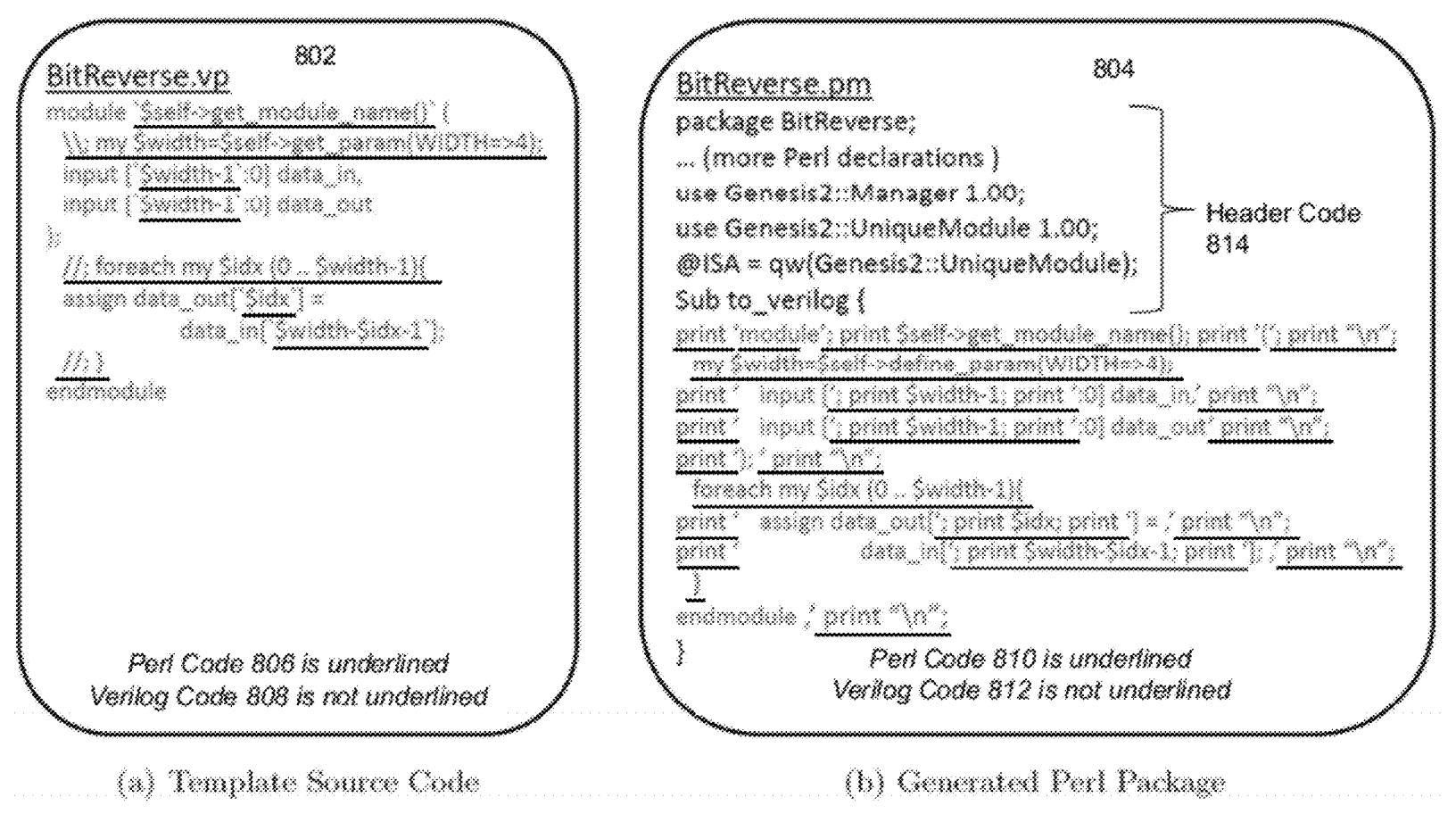

FIG. 8 shows how a Template 802, which contains both Verilog Code 808 (not underlined) and Perl Code 806 (underlined) interleaved, is parsed and transformed into a Perl Package 804. Perl package 804 is attached with Header Code 814 to import relevant libraries, and to inherit the UniqueModule.pm package, among other things. UniqueModule.pm holds code that constructs the system: a data-structure to hold parent and child instances, a data-structure to hold parameters' names, values and priorities, and API methods to handle and manipulate these data structures.

Shown in FIG. 8(a) is the coding for a bit-reversing Template 802. An input parameter for this template, WIDTH, receives a default value of 4. As shown, a for-loop is used to assign the output port to the input data in reverse order. FIG. 8(a) shows the code as written by the hardware designer that includes Perl Code 806 (underlined in FIG. 8(a)) and Verilog Code 808 (not underlined). FIG. 8(b) shows the transformation of such code into Perl Package 804. As shown, Perl Package 804 includes Perl Code 810 (underlined), Verilog Code 812 (not underlined), and Header Code 814 (indicated by bracket). A set of templates becomes a set of Perl Packages for the chip generator according to an embodiment of the present invention. These Perl packages inherit from one base class, UniqueModule.pm, which defines hierarchy and parameter databases, along with methods for accessing them. Each such package can then be instantiated using the unique inst method (also inherited from the UniqueModule.pm class), and each instance is then capable of generating the relevant module based on its particular parameter value assignments.

An important API call that templates inherit from the base template (e.g., inherit from the base package UniqueModule.pm), is the method unique inst. A call to $self→unique inst(SomeTemplateName, NewInstName, PrmName=>PrmVal), returns a handle to a new object instance. This method call is in fact a call to template SomeTemplateName's constructor, since after parsing, it is translated into a call to the generated Perl package SomeTemplateName.pm's constructor.

Interestingly enough, the result is that each Perl object (returned by the unique inst method) is uniquely tied to a Verilog object. Even though Perl and Verilog are on two different layers, the hardware designer has the illusion that they (the Verilog and the Perl layers) are one and the same.

A key to achieving system and instance scopes, rather than just pre-processing files, is that the intermediate representation for the templates is first created, and then assemble them into a full object oriented program with a centralized database of instances and types. This facilitates our ability to acquire handles from one instance to the other, for example, for querying of parameters. Each such package also has a to Verilog method, and it is the activation of these methods throughout the hierarchy that generates the final Verilog code. Note that unlike typical pre-processors, since to Verilog is a method (not a function), it is called on an instance basis, generating a unique module when needed. This means that a single template that is instantiated in multiple places and whose parameters get different values for each of these instances, would in fact have its to Verilog method called multiple times, once per instance, potentially generating multiple unique modules in multiple output files.

To better understand how the method call to unique inst orchestrates the different parameter value assignments, the generation of code and the uniquification, FIG. 9 provides the method's pseudo-code 902. As shown, note that any call to unique inst to create a sub-instance would be part of the parent instance generation process as coded in its own to Verilog method, with the single exception of the top template which is instantiated by the Manager.pm package for the chip generator according to an embodiment of the present invention.

Figure 10:
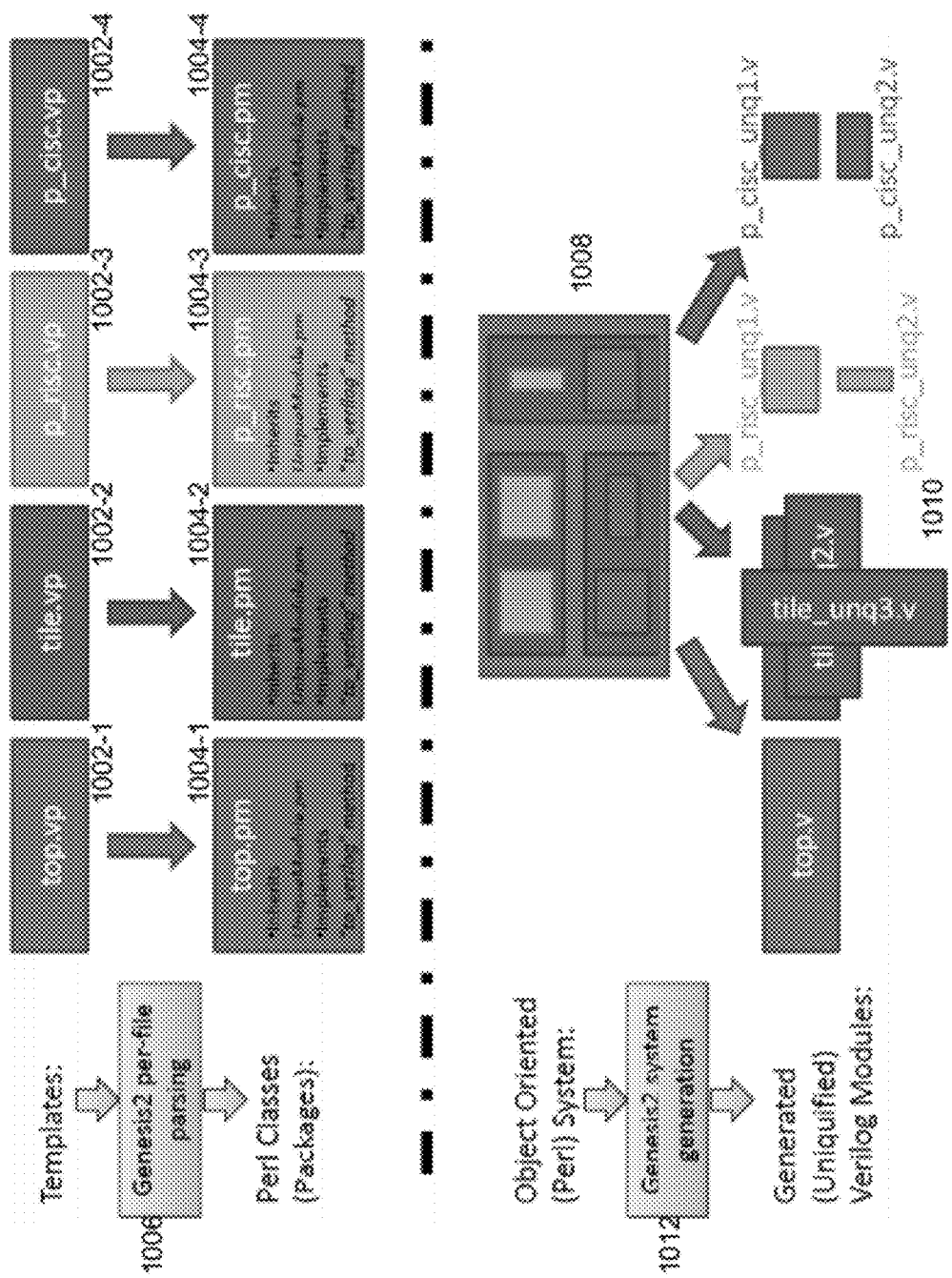
FIG. 10 shows how a complete design hierarchy is generated according to an embodiment of the present invention.

FIG. 10 shows how a complete design hierarchy is generated. First, the templates 102 are parsed (see block 1006) into Perl packages 1004. Together, these packages represent an exact dual of the hardware design hierarchy. Then, a run of this program (see block 1012) traverses the entire hierarchy of the design 1008 to produce the Verilog modules 1010).

While the forgoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention.

It should be appreciated by those skilled in the art that the specific embodiments disclosed above may be readily utilized as a basis for modifying or designing other electronic design automation tools. It should also be appreciated by those skilled in the art that such modifications do not depart from the scope of the invention as set forth in the appended claims.

What is claimed is:

1. A method for designing integrated circuits, comprising:
receiving, by a computer, a generalized design of an integrated circuit design based on generalized design specifications;
receiving, by the computer, a high-level description of an integrated circuit within the generalized design;
receiving, by the computer, embedded design trade-off information using a programming language within the generalized design, wherein the programming language is configured to modify the high-level description using a predetermined set of design parameters;
receiving, by the computer, a first set of values for the predetermined set of design parameters;
generating, by the computer, a first particularized design of the integrated circuit design based on the first set of values for the predetermined set of design parameters.

2. The method of claim 1, wherein the high-level description language is a hardware description language.

3. The method of claim 1, wherein the programming language is a scripting language.

4. The method of claim 1, wherein a performance characteristic of the integrated circuit design in improved.

5. The method of claim 1, further comprising validating the generalized design of an integrated circuit.

6. The method of claim 5, wherein the first particularized design is consistent with the validated generalized design.

7. The method of claim 1, wherein at least one of the first set of values for the predetermined set of design parameters is set at a late binding stage of a circuit design.

8. The method of claim 1, wherein at least one of the first set of values for the predetermined set of design parameters is set after substantially the rest of the first set of values for the predetermined set of design parameters.

9. The method of claim 1, further comprising
receiving, by the computer, a second set of values for the predetermined set of design parameters;
generating a second particularized design of the integrated circuit design based on the second set of values for the predetermined set of design parameters.

10. The method of claim 1, further comprising providing a user interface for defining the first set of values.

11. A non-transitory computer-readable medium including instructions that, when executed by a processing unit, cause the processing unit to generate a design for an integrated circuit, by performing the steps of:
receiving a generalized design of an integrated circuit design based on generalized design specifications;
embedding a high-level description of an integrated circuit within the generalized design;
embedding design trade-off information using a programming language within the generalized design, wherein the programming language is configured to modify the high-level description using a predetermined set of design parameters;
defining a first set of values for the predetermined set of design parameters;
generating a first particularized design of the integrated circuit design based on the first set of values for the predetermined set of design parameters.

12. The non-transitory computer-readable medium of claim 11, wherein the high-level description language is a hardware description language.

13. The non-transitory computer-readable medium of claim 11, wherein the programming language is a scripting language.

14. The non-transitory computer-readable medium of claim 11, wherein a performance characteristic of the integrated circuit design is improved.

15. The non-transitory computer-readable medium of claim 11, further comprising the step of validating the generalized design of an integrated circuit.

16. The non-transitory computer-readable medium of claim 15, wherein the first particularized design is consistent with the validated generalized design.

17. The non-transitory computer-readable medium of claim 11, wherein at least one of the first set of values for the predetermined set of design parameters is set at a late binding stage of a circuit design.

18. The non-transitory computer-readable medium of claim 11, wherein at least one of the first set of values for the predetermined set of design parameters is set after substantially the rest of the first set of values for the predetermined set of design parameters.

19. The non-transitory computer-readable medium of claim 11, further comprising the steps of
receiving a second set of values for the predetermined set of design parameters;
generating a second particularized design of the integrated circuit design based on the second set of values for the predetermined set of design parameters.

20. The non-transitory computer-readable medium of claim 11, further comprising the step of providing a user interface for defining the first set of values.

21. A computing device comprising:
a data bus;
a memory unit coupled to the data bus;
a processing unit coupled to the data bus and configured to
receive a generalized design of an integrated circuit design based on generalized design specifications;
receive a high-level description of an integrated circuit within the generalized design;
receive embedded design trade-off information using a programming language within the generalized design, wherein the programming language is configured to modify the high-level description using a predetermined set of design parameters;
receive a first set of values for the predetermined set of design parameters;
generate a first particularized design of the integrated circuit design based on the first set of values for the predetermined set of design parameters.

* * * * *